(12) United States Patent
Koester et al.

(10) Patent No.: US 8,063,298 B2
(45) Date of Patent: Nov. 22, 2011

(54) METHODS OF FORMING EMBEDDED THERMOELECTRIC COOLERS WITH ADJACENT THERMALLY CONDUCTIVE FIELDS

(75) Inventors: David A. Koester, Burlington, NC (US); Randall G. Alley, Raleigh, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 1267 days.

(21) Appl. No.: 11/563,443

(22) Filed: Nov. 27, 2006

(65) Prior Publication Data

US 2007/0089773 A1 Apr. 26, 2007

Related U.S. Application Data

(63) Continuation-in-part of application No. 10/970,378, filed on Oct. 22, 2004, now Pat. No. 7,523,617.

(60) Provisional application No. 60/740,153, filed on Nov. 28, 2005, provisional application No. 60/779,210, filed on Mar. 3, 2006.

(51) Int. Cl.
*H01L 35/02* (2006.01)
*H01L 35/34* (2006.01)

(52) U.S. Cl. ........ 136/203; 136/204; 361/704; 361/717; 361/718; 361/719; 62/3.2; 62/3.3; 62/3.7

(58) Field of Classification Search .................. 136/203, 136/204; 361/704, 717–719; 62/3.2, 3.3, 62/3.7; 257/706, 707, 712, 713, 717, 903
See application file for complete search history.

(56) References Cited

U.S. PATENT DOCUMENTS

| 3,136,134 A | 6/1964 | Smith |
| 3,296,034 A | 1/1967 | Reich |
| 3,607,444 A | 9/1971 | Debucs |
| 3,663,307 A | 5/1972 | Mole |
| 4,443,650 A | 4/1984 | Takagi et al. |
| 5,006,178 A * | 4/1991 | Bijvoets ........................ 136/211 |
| 5,254,178 A | 10/1993 | Yamada et al. |
| 5,430,322 A | 7/1995 | Koyanagi et al. |
| 5,837,929 A | 11/1998 | Adelman |

(Continued)

FOREIGN PATENT DOCUMENTS

EP 0 687 020 12/1995

(Continued)

OTHER PUBLICATIONS

International Search Report and Written Opinion for PCT/US2006/045535; Jan. 3, 2008.

(Continued)

*Primary Examiner* — Jennifer Michener
*Assistant Examiner* — Matthew Martin
(74) *Attorney, Agent, or Firm* — Myers Bigel Sibley & Sajovec, P.A.

(57) ABSTRACT

A method of forming a thermoelectric device may include providing a substrate having a surface, and thermally coupling a thermoelectric p-n couple to a first portion of the surface of a substrate. Moreover, the thermoelectric p-n couple may include a p-type thermoelectric element and an n-type thermoelectric element. In addition, a thermally conductive field layer may be formed on a second portion of the surface of the substrate adjacent the first portion of the surface of the substrate. Related structures are also discussed.

27 Claims, 13 Drawing Sheets

U.S. PATENT DOCUMENTS

| | | | |
|---|---|---|---|
| 5,841,064 A * | 11/1998 | Maekawa et al. | 136/203 |
| 5,865,975 A | 2/1999 | Bishop | |
| 5,869,242 A | 2/1999 | Kamb | |
| 5,874,219 A | 2/1999 | Rava et al. | |
| 5,900,071 A | 5/1999 | Harman | |
| 5,922,988 A | 7/1999 | Nishimoto | |
| 6,060,331 A | 5/2000 | Shakouri et al. | |
| 6,060,657 A | 5/2000 | Harman | |
| 6,062,681 A | 5/2000 | Field et al. | |
| 6,071,351 A | 6/2000 | Venkatasubramanian | |
| 6,072,925 A | 6/2000 | Sakata | |
| 6,084,050 A | 7/2000 | Ooba et al. | |
| 6,094,919 A | 8/2000 | Bhatia | |
| 6,154,266 A | 11/2000 | Okamoto et al. | |
| 6,154,479 A | 11/2000 | Yoshikawa et al. | |
| 6,180,351 B1 | 1/2001 | Cattell | |
| 6,271,459 B1 | 8/2001 | Yoo | |
| 6,282,907 B1 | 9/2001 | Ghoshal | |
| 6,300,150 B1 | 10/2001 | Venkatasubramanian | |
| 6,347,521 B1 | 2/2002 | Kadotani et al. | |
| 6,365,821 B1 | 4/2002 | Prasher | |
| 6,374,616 B2 * | 4/2002 | Ohkubo et al. | 62/3.7 |
| 6,384,312 B1 | 5/2002 | Ghoshal et al. | |
| 6,403,876 B1 | 6/2002 | Ghoshal et al. | |
| 6,410,971 B1 | 6/2002 | Otey | |
| 6,412,286 B1 | 7/2002 | Park et al. | |
| 6,424,533 B1 * | 7/2002 | Chu et al. | 361/719 |
| 6,505,468 B2 | 1/2003 | Venkatasubramanian | |
| 6,605,772 B2 | 8/2003 | Harman et al. | |
| 6,696,635 B2 | 2/2004 | Prasher | |
| 6,826,916 B2 | 12/2004 | Shimada | |
| 6,867,978 B2 | 3/2005 | Whittenburg et al. | |
| 7,005,320 B2 | 2/2006 | Kwon | |
| 7,005,738 B2 | 2/2006 | Zuo et al. | |
| 7,009,289 B2 | 3/2006 | Hu et al. | |
| 7,038,316 B2 | 5/2006 | Hu et al. | |
| 2001/0052234 A1 | 12/2001 | Venkatasubramanian | |
| 2002/0033189 A1 | 3/2002 | Macris | |
| 2002/0053359 A1 | 5/2002 | Harman et al. | |
| 2002/0069906 A1 | 6/2002 | Macris | |
| 2002/0139123 A1 | 10/2002 | Bell | |
| 2005/0178423 A1 * | 8/2005 | Ramanathan et al. | 136/201 |

FOREIGN PATENT DOCUMENTS

| | | |
|---|---|---|
| EP | 0 915 515 A2 | 5/1999 |
| JP | 6-97512 | 4/1994 |
| WO | 0 805 501 | 11/1997 |
| WO | WO98/43740 | 10/1998 |
| WO | WO98/44562 | 10/1998 |
| WO | WO 00/49664 | 8/2000 |
| WO | WO 01/08800 | 2/2001 |

OTHER PUBLICATIONS

International Search Report and Written Opinion for PCT/US2006/045535; Sep. 10, 2007.
US 6,381,965, 5/2002, (withdrawn).
Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.
Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.
Samuel K. Moore, Making Chips, IEEE Spectrum, Biotechnology, Mar. 2001, pp. 54-60.
Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.
Ideal Electronic Properties of a p-Ge/p-$Al_{0.85}Ga_{0.16}$As Interface, Rama Venkatasubramanian et al., Appl. Phys. Lett., vol. 59, No. 3, Jul. 15, 1991, pp. 318-320.
Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.
Visible Light Emission From Quantized Planar Ge Structures, Rama Venkatasubramanian et al., Appl. Phys. Lett., vol. 59, No. 13, Sep. 23, 1991, pp. 1603-1605.
High Quality GaAs on Si Using $Si_{0.04}Ge_{0.96}$/Ge Buffer Layers, Rama Venkatasbramanian, et al., Journal of Crystal Growth 107 (1991) pp. 489-493.
The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian.
Optimization of the Heteroepitaxy of Ge on GaAs for Minority-Carrier Lifetime, Rama Venkatasubramanian, et al., Journal of Crystal Growth 112 (1991) pp. 7-13.
Intrinsic Recombination and Interface Characterization in "surface-free" GaAs Structures, D.J. Wolford et al., J. Vac. Sci. Technol. B. vol. 9, No. 4, Jul./Aug. 1991, pp. 2369-2376.
High-Quality Eutectic-Metal-Bonded AlGaAs-GaAs Thin Films on SI Substrates, Rama Venkatasubramanian et al., Appl. Phys. Lett., vol. 60, No. 7, Feb. 17, 1992, pp. 886-888.
Photoluminescence of Porous Silicon Buried Underneath Epitaxial GaP, J.C., Campbell, et al., Appl. Phys. Lett., vol. 60, No. 7, Feb. 17, 1992, pp. 889-891.
Thermal Characterization of $Bi_2$, $Te_3$/$Sb_2$ $Te_3$ Superlattices, M.N. Touzelbaev amd P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 22709-2195, K.E. Goodson Electronic mail goodson@vk.stanford.edu, Journal of Applied Physics, vol. 90, No. 2, Jul. 15, 2001, pp. 763-767.
Smaller, Faster, Efficient Thermoelectric Cooling, Rama Venkatasubramanian. vol. 30, No. 41, Oct. 17, 2001 ISSN: 0300-757X, pp. 1-2.
CVD Diamond for Components and Emitters, J. Davidson, Corresponding Author, e-mail address: jld@vuse.vanderbilt.edu (J. Davidson) et al., Vanderbilt University 2201 West End Avenue, Nashville, TN 37235, USA, Diamond and Related Materials 10 (2001) pp. 1736-1742.
Sneak Preview, Optical Device Transfers Data Fast, Rama Venkatasubramanian, design news Dec. 17, 2001. p. 14.
Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000—II, pp. 3091-3097.
Phonon-Blocking Electron-Transmitting Structured, Rama Venkatasubramanian et al., Research Triangle Institute, Research Triangle Park, NC, USA, 18 International Conference on Thermoelectric (1999), pp. 100-103.
Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 675-686.
RTI International, "New Thermoelectric Materials Can Keep Chips Cool Advances in Fiber Optics and in Biotechnology also are Likely" Oct. 9, 2001.
RTI International Annual Report 2001, Turning Knowledge into Practice, pp. 4-37.
Cooling Film Tempers Tiny Hot Spots, Rama Venkatasubramanian et al, Science News, No. 3, 2001, v160, i18, p. 280.
Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 3, 1988, pp. 1308-1310.
Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol. 66, No. 11, Dec. 1, 1989, pp. 5662-5664.
Radiative Recombination in Surface free $n^+In^-In^+GaAs$ Homostructures, L.M. Smith and D.J. Wolford et al., Appl. Phys. Lett., vol. 57, No. 15, Oct. 8, 1990, pp. 1572-1574.

Measurement of Al/GaAs/AlGaAs Interface Recombination Velocities Using Time-Resolved Photoluminescence, M.L. Timmons, et al., Appl. Phys. Lett. vol. 56, No. 19, May 7, 1990, pp. 1850-1852.
Thin-Film Thermoelectric Devices with High Room-Temperature Figures of Merit, Rama Venkatasubramanian et al., Research Triangle Institute, Research Triangle Park, North Carolina 27709, USA, 2001 Macmillian Magazines Lt., Nature, vol. 413, Oct. 11, 2001, www.nature.com pp. 597-602.
In-situ Monitoring of the Growth of $Bi_2Te_3$ and $Sb_2Te_3$ Superlattice Using Spectroscopic Ellipsometry Hao Cui et al. Journal of Electronic Materials, vol. 30, No. 11 2001, Special Issue Paper, pp. 1376-1381.
Incorporation Processes in MBE Growth of ZnSe, Rama Venkatasubramanian et al., Journal of Crystal Growth 95 (1989) pp. 533-537.
An Inverted-Growth Approach to Development of an Ir-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.
Development of 20% Efficient GainAsP Solar Cells, P.R. Sharps, et. al., 1993 IEEE pp. 633-638.
Development of High-Efficiency $Al_{0.2}Ga_{0.8}As$ Solar Cells and Interconnect Schemes for $Al_{0.2}Ga_{0.3}As/Si$ Mechanically-Stacked Cascade Cells, Rama Venkatasubramanian, et al., 1993 IEEE pp. 752-756.
Photoreflectance Characterization of InP and GaAs Solar Cells, R.G. Rodrigues et al., 1993 IEEE pp. 681-685.
Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.
GaAs and $Al_{0.2}Ga_{0.8}As$ Solar Cells With an Indirect-Bandgap $Al_{0.8}Ga_{0.2}As$ Emitter—Heterojunction Cells, Rama Venkatasubramanian et al., Research Triangle Institute, RTP, NC 27709, H. Field and K. Emery, National Renewable Energy Laboratory (NREL), Golden, CO 80401, First WCPEC: Dec. 5-9, 1994; Hawaii, pp. 1839-1842.
The Growth and Radiation Response of $N^+p$ Deep Homojunction InP Solar Cells, M.J. Panunto et al., M.L. Timmons, et al., First WCPEC; Dec. 5-9, 1994; Hawaii, pp. 2192-2195.
Material and Device Characterization Toward High-Efficiency GaAs Solar Cells on Optical-Grade Polycrystalline Ge Substrates, Rama Venkatasubramanian, et al., R. Ahrenkiel, et. al, First WCPEC; Dec. 5-0, 1994; Hawaii, 1994 IEEE pp. 1692-1696.
Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.
Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.
High-Efficiency Tandem Solar Cells on Single- and Poly-Crystalline Substrates, J.A. Hutchby et al., Center for Semiconductor Research, Research Triangle Institute, Research Triangle Park, NC 27709, USA, Solar-Energy Materials and Solar Cells 35 (1994) pp. 9-24.
Optoelectronic Properties of Eutectic-Metal-Bonded (EMB) GaAs-AIGaAs Structures on Si Substrates, Rama Venkatasubramanian, et al., Solid-State Electronics vol. 37, No. 11, pp. 1809-1815, 1994.
Heteroepitaxy and Characterization of Ge-rich SiGe Alloys on GaAs, Rama Venkatasubramanian et al., J. Appl. Phys. vol. 69. No. 12, Jun. 15, 1991, pp. 8164-8167.
18.2% (AM1.5) Efficient GaAs Solar Cell on Optical-Grade Polycrystalline Ge Substrate, Rama Venkatasubramanian et al., 25th PVSC; May 13-17, 1996; Washington, D.C. 1996 IEEE pp. 31-36.
Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, 15th International Conference on Thermoelectrics (1996), 1996 IEEE pp. 454-458.
Thermal Conductivity of Si-Ge Superlattices, S.-M. Lee and David G. Cahill[a)], Rama Venkatasubramanian, Appl. Phys. Lett. vol. 70, No. 22, Jun. 2, 1997, pp. 2957-2959.
20% (AM1.5) Efficiency GaAs Solar Cells on Sub-mm Grain-Size Poly-Ge and Its Transition to Low-Cost Substrates, Rama Venkatasubramanian et al., 26th PVSC: Sep. 30-Oct. 3, 1997; Anaheim, CA 1997 IEEE, pp. 811-814.
Electronic and Mechanical Properties of Ge Films Grown on Glass Substrates, R.K. Ahrenkiel et al., 26th PVSC; Sep. 30-Oct. 3, 1997; Anaheim, CA, pp. 527-529.
MOCVD of $Bi_2Te_3$ and Their Superlattice Structures for Thin-Film Thermoelectric Applications, Rama Venkatasubramanian et al., Journal of Crystal Growth 170 (1997), pp. 817-821.
A Silent Cool: Thermoelectrics May Offer New Ways to Refrigerate and Generate Power, Corinna Wu, Science News, Sep. 6, 1997 v152 n10 p. 152(2), pp. 1-3.
ONR Contributes to Thermoelectric Research (Office of Naval Research) (Brief Article), Ozone Depletion Network Online Today, Contact ONR, website http://www.onr.navy.mil., Nov. 2001.
In-Plane Thermoelectric Properties of Freestanding Si/Ge Superlattice Structures, Rama Venkatasubramanian et al., 17th International Conference on Thermoelectrics (1998), pp. 191-197.
Potential of Si-based Superlattice Thermoelectric Materials for Integration with Si Microelectronics, Rama Venkatasubramanian et al., 1998 IEEE, p. 869.
Low-temperature Organometallic Epitaxy and Its Application to Superlattice Structures in Thermoelectrics, Rama Venkatasubramanian, [a)], et al., Sandra Liu and Nadia El-Masry, Michael Lamvik, Applied Physics Letters, vol. 75, No. 8, Aug. 23, 1999, pp. 1104-1106.
Optical Constants of $Bi_2Te_3$ and $Sb_2Te_3$ Measured Using Spectroscopic Ellipsometry, HAO CUI,[1] I.B. BHAT[1,3] and Rama Venkatasubramanian[2], 1-Electrical, Computer and Systems Engineering Department, Rensselaer Polytechnic Institute, Troy, NY 12180-3590, USA. 2.-Research Triangle Institute, Research Triangle Park, NC 27709, USA, 3-e-mail:bhati@.rpi.edu., Journal of Electronics Materials, Vol. 28, No. 10, 1999, pp. 1111-1114.
Thin-Film Technology, Research Triangle Institute, Investment Opportunities, in Thermoelectronics, Apr. 6, 2001, website http://www.rti.org/units/es.cfm, pp. 1-2.
Nature Publishing Group, Materials Update, Cool Future for Semiconductors, Oct. 11, 2001. pp. 1-3.
Cool New Film, Science Update, Oct. 11, 2001, http://www.nature.com/nsu/011011/0111011-12.html, pp. 1-2.
Semiconductors are Cool, News and Views, Cronin B. Vining, 2001 Macmillan Magazines Ltd., Nature, vol. 413, Oct. 11, 2001, www.nature.com, pp. 577-578.
Thermoelectric Boost, Richard Babyak, Appliance Manufacturer, Design and Engineering Solutions for the Global Appliance Industry, http://www.ammagazine.com/CDA/ArticleInformation/features/ BNP Features Item/0.260... Jul. 18, 2002, pp. 1-2.
Thermoelectrics from Hot to Cool, New Technology Offers Efficient way to Heat or Cool ICS in Operation, Jeff Dorsch, Semiconductor Magazine, http://www.semi.org/web/wmagazine.nsf/ 4f55b97743c2d02e882565bf006c2459/27e74866ea..., Jun. 20, 2002, pp. 1-3.
Nanostructured Superlattice Thin-Film Thermoelectric Devices; Nanotechnology and the Environment Applications and Implications; American Chemical Society (2005) (ACS Symposium Series 890) Chapter 47, pp. 347-352.
Grove issues power warning at IEDM lunch; David Lammers (Dec. 10, 2002) http://www.eetimes.com/showArticle. jhtml?articleID=10806530,; EETIMES online.

* cited by examiner

METHODS OF FORMING EMBEDDED THERMOELECTRIC COOLERS WITH ADJACENT THERMALLY CONDUCTIVE FIELDS

RELATED APPLICATIONS

The present application claims the benefit of priority from U.S. Provisional Application No. 60/740,153 filed Nov. 28, 2005, and from U.S. Provisional Application No. 60/779,210 filed Mar. 3, 2006. The present application also claims the benefit of priority as a continuation-in-part of U.S. patent application Ser. No. 10/970,378 filed Oct. 22, 2004 now U.S. Pat. No. 7,523,617. The disclosures of each of the above referenced U.S. provisional and utility applications are hereby incorporated herein in their entirety by reference.

FIELD OF THE INVENTION

The present invention relates to the field of electronics, and more particularly to thermoelectric device structures and related methods.

BACKGROUND

Thermoelectric materials may be used to provide cooling and/or power generation according to the Peltier effect. Thermoelectric materials are discussed, for example, in the reference by Venkatasubramanian et al. entitled "Phonon-Blocking Electron-Transmitting Structures" (18th International Conference On Thermoelectrics, 1999), the disclosure of which is hereby incorporated herein in its entirety by reference.

Cooling assemblies including thermoelectric cooling elements are discussed in U.S. Pat. No. 6,424,533 to Chu et al. entitled "Thermoelectric-Enhanced Heat Spreader For Heat Generating Component Of An Electronic Device," the disclosure of which is hereby incorporated herein in its entirety by reference. As discussed in the abstract of the Chu et al. patent, a thermal dissipation subassembly for an electronic device includes a thermal spreader configured to thermally couple to a surface of a heat generating component of the electronic device. The heat generating component, e.g., an integrated circuit chip, has a non-uniform thermal distribution across the surface thereof between at least one first region of the surface and at least one second region of the surface, with the at least one first region having a higher heat flux than the at least one second region. The subassembly further includes at least one thermoelectric device aligned to at least a portion of each first region having the higher heat flux, wherein the at least one thermoelectric device facilitates dissipation of the higher heat flux. In one embodiment, one or more thermoelectric devices are embedded within the thermal spreader and thermally isolated therefrom.

SUMMARY

According to some embodiments of the present invention, a method of forming a thermoelectric device may include providing a substrate having a surface, and thermally coupling a thermoelectric p-n couple to a first portion of the surface of a substrate. The thermoelectric p-n couple may include a p-type thermoelectric element and an n-type thermoelectric element. In addition, a thermally conductive field layer may be formed on a second portion of the surface of the substrate adjacent the first portion of the surface of the substrate.

Forming the thermally conductive field layer may include plating the thermally conductive field layer on the second portion of the surface of the substrate, and the thermally conductive field layer may include a metal such as copper.

After forming the thermally conductive field layer, a thermal coupling may be provided between the thermoelectric p-n couple and a second substrate and between the thermally conductive field layer and the second substrate. Accordingly, the p-type thermoelectric element and the n-type thermoelectric element may be thermally coupled in parallel between the first and second substrates.

For example, the first substrate may include a semiconductor integrated circuit substrate, and the second substrate may include a thermally conductive heat spreader. In addition, the semiconductor integrated circuit substrate may be bonded to a third substrate so that the semiconductor integrated circuit substrate is between the third substrate and the thermally conductive heat spreader, and edges of the thermally conductive heat spreader may be bonded to the third substrate.

In an alternative, the first substrate may include a thermally conductive heat spreader, and the second substrate may include a semiconductor integrated circuit substrate. In addition, the semiconductor integrated circuit substrate may be bonded to a third substrate so that the semiconductor integrated circuit substrate is between the third substrate and the thermally conductive heat spreader, and edges of the thermally conductive heat spreader may be bonded to the third substrate.

Forming the thermally conductive field layer may include forming first and second thermally conductive field layers, and the thermoelectric p-n couple may be electrically coupled in series between the first and second thermally conductive field layers. The surface of the substrate may include as electrically insulating material, and thermally coupling the thermoelectric p-n couple to the first portion of the surface may include bonding the thermoelectric p-n couple to the first portion of the surface.

A thickness of the thermally conductive field layer may be at least half of a thickness of the thermoelectric p-n couple, and the thickness of the thermally conductive field layer may be less than a thickness of the thermoelectric p-n couple. Moreover, thermally coupling the thermoelectric p-n couple to the first portion of the surface of the substrate may precede forming the thermally conductive field layer.

According to some other embodiments of the present invention, a method of forming a thermoelectric device may include providing a substrate including a recess in a surface thereof, and the recess may include a bottom surface and sidewalls. A thermoelectric p-n couple may be bonded to the bottom surface of the recess in the substrate, and the thermoelectric p-n couple may include a p-type thermoelectric element and an n-type thermoelectric element. Accordingly, the p-type and n-type thermoelectric elements may be thermally coupled to the bottom surface of the recess.

Providing the substrate may include providing a substrate having a substantially planar surface. A thermally conductive field layer may be selectively formed on first portions of the substantially planar surface while maintaining second portions of the substantially planar surface free of the thermally conductive field layer. In an alternative, providing the substrate may include providing a substrate having a substantially planar surface and removing portions of the substantially planar surface to define the recess. Moreover, the substrate may include a metal such as copper.

After bonding the thermoelectric p-n couple, a thermal coupling may be provided between the thermoelectric p-n couple and a second substrate and between the surface of the first substrate outside the recess and the second substrate. Accordingly, the p-type thermoelectric element and the n-type thermoelectric element may be thermally coupled in parallel between the first and second substrates.

For example, the first substrate may include a semiconductor integrated circuit substrate, and the second substrate may include a thermally conductive heat spreader. The semiconductor integrated circuit substrate may be bonded to a third substrate so that the semiconductor integrated circuit substrate is between the third substrate and the thermally conductive heat spreader, and edges of the thermally conductive heat spreader may be bonded to the third substrate.

In an alternative, the first substrate may include a thermally conductive heat spreader, and the second substrate may include a semiconductor integrated circuit substrate. The semiconductor integrated circuit substrate may be bonded to a third substrate so that the semiconductor integrated circuit substrate is between the third substrate and the thermally conductive heat spreader, and edges of the thermally conductive heat spreader may be bonded to the third substrate.

The bottom surface of the recess may include an electrically insulating material, and bonding the thermoelectric p-n couple to the bottom surface of the recess may include solder bonding the thermoelectric p-n couple to the bottom surface of the recess. A depth of the recess may be at least half of a thickness of the thermoelectric p-n couple, and the depth of the recess may be less than a thickness of the thermoelectric p-n couple.

According to still other embodiments of the present invention, a thermoelectric device may include a substrate having a surface, and a thermoelectric p-n couple bonded to a first portion of the surface of a substrate. More particularly, the thermoelectric p-n couple may include a p-type thermoelectric element and an n-type thermoelectric element. In addition, a thermally conductive field layer may be on a second portion of the surface of the substrate adjacent the first portion of the surface of the substrate.

According to yet other embodiments of the present invention, a thermoelectric device may include a substrate having a surface, and a thermoelectric p-n couple thermally coupled to a first portion of the surface of a substrate. More particularly, the thermoelectric p-n couple may include a p-type thermoelectric element and an n-type thermoelectric element. In addition, a first thermally conductive field layer may be on a second portion of the surface of the substrate adjacent the first portion of the surface of the substrate, and a second thermally conductive field layer may be on a third portion of the surface of the substrate adjacent the first portion of the surface of the substrate. Moreover, the p-type and n-type thermoelectric elements may be electrically coupled in series between the first and second thermally conductive field layers.

According to more embodiments of the present invention, a thermoelectric device may include a substrate having a recess in a surface thereof, and the recess may include a bottom surface and sidewalls. A thermoelectric p-n couple may be bonded to the bottom surface of the recess in the substrate, and the thermoelectric p-n couple may include a p-type thermoelectric element and an n-type thermoelectric element. Moreover, the p-type and n-type thermoelectric elements may be thermally coupled to the bottom surface of the recess.

DETAILED DESCRIPTION

Figure 1A:
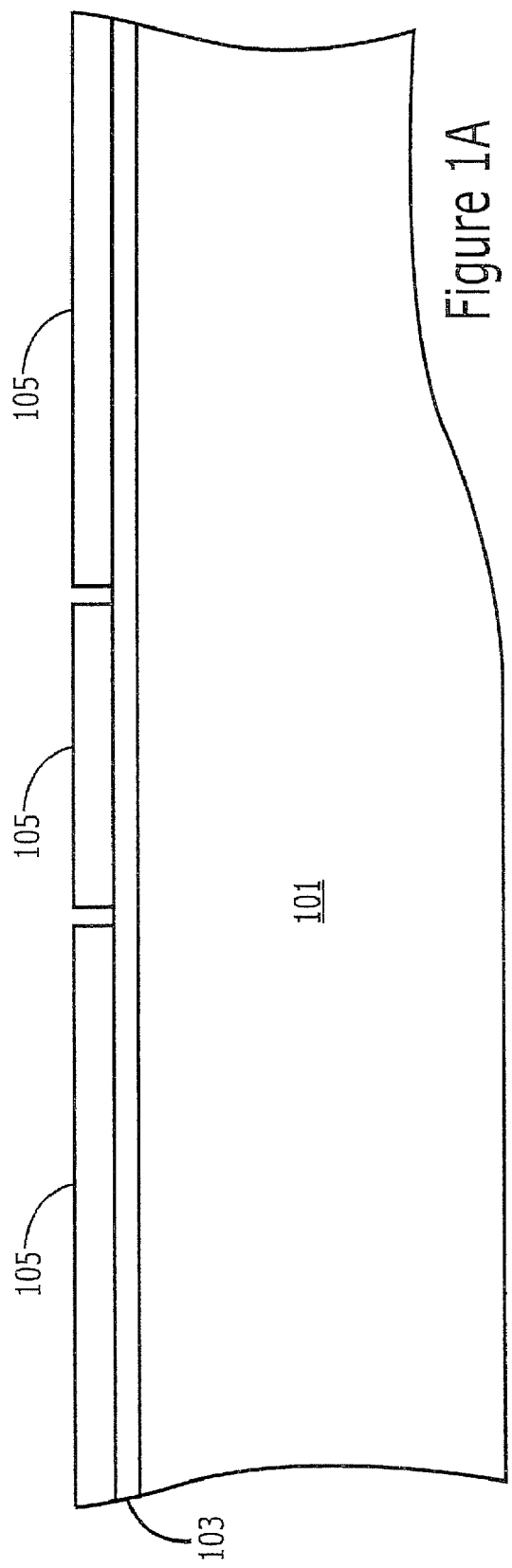
FIGS. 1A-C and 2A-C are cross-sectional views illustrating operations of forming thermoelectric cooling structures according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

According to some embodiments of the present invention, a thermoelectric cooling (TEC) device may be embedded in a thermally conductive heat spreader, and the embedded TEC device may be aligned with a hot spot on the backside of an integrated circuit (IC) chip to provide localized active cooling thereof. Moreover, portions of the heat spreader or IC chip surrounding the embedded TEC may be thermally coupled to portions of the backside of the IC chip surrounding the hot spot to provide passive cooling thereof. The embedded TEC device and the surrounding portions of the heat spreader may thus provide a substantially planar surface so that both the embedded TEC and the surrounding portions of the heat spreader may be in thermal contact with the substantially planar backside of the IC device. According to some embodiments of the present invention, surrounding portions of the heat spreader may be slightly recessed relative to a surface of the TEC device to improve thermal contact between the TEC device and the hot spot of the IC device.

According to other embodiments of the present invention, a TEC device may be embedded in a backside of an IC chip, and a heat spreader may be provided on the TEC device to provide localized active cooling of the IC chip. Accordingly, the embedded TEC device and surrounding portions of the IC chip may provide a substantially planar surface so that both the embedded TEC and the surrounding portions of the IC chip may be in thermal contact with a substantially planar surface of a heat spreader. According to some embodiments of the present invention, surrounding portions of the IC chip may be slightly recessed relative to a surface of the TEC device to improve thermal contact between the TEC device and the heat spreader.

Figure 1B:
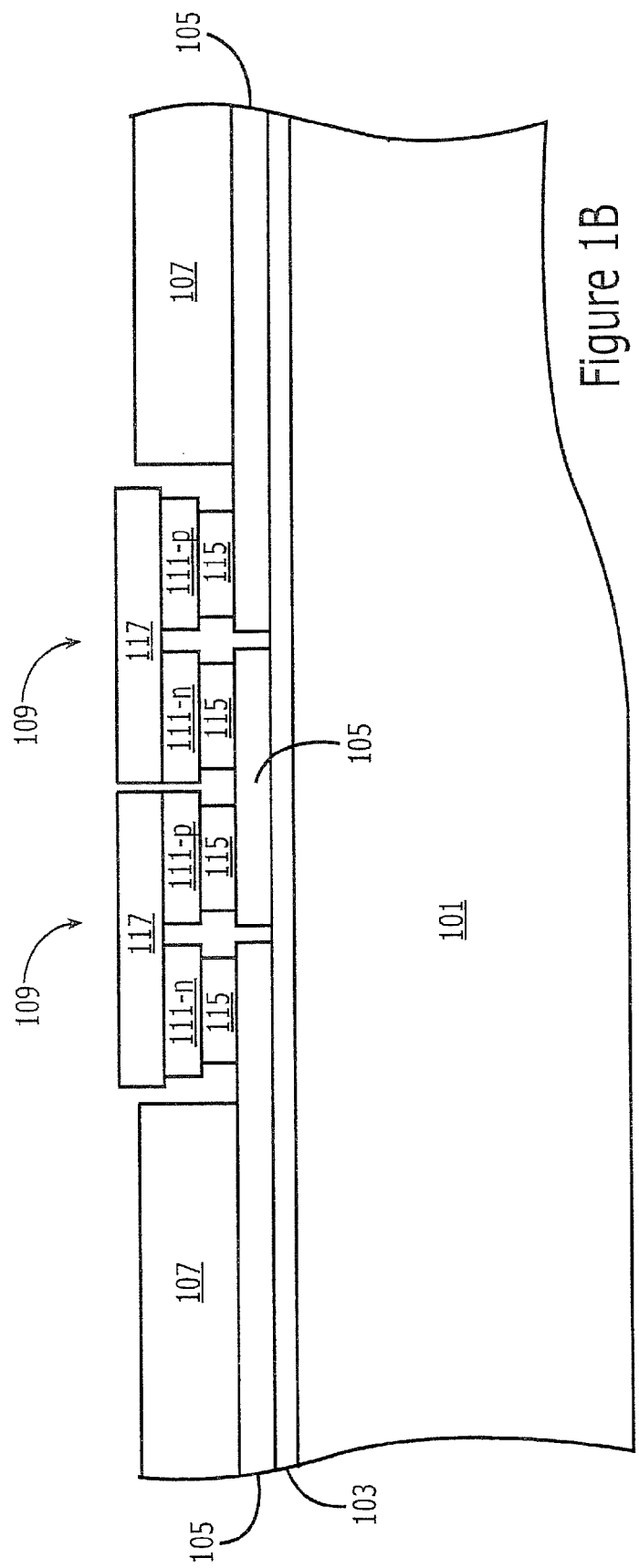
Figure 3:
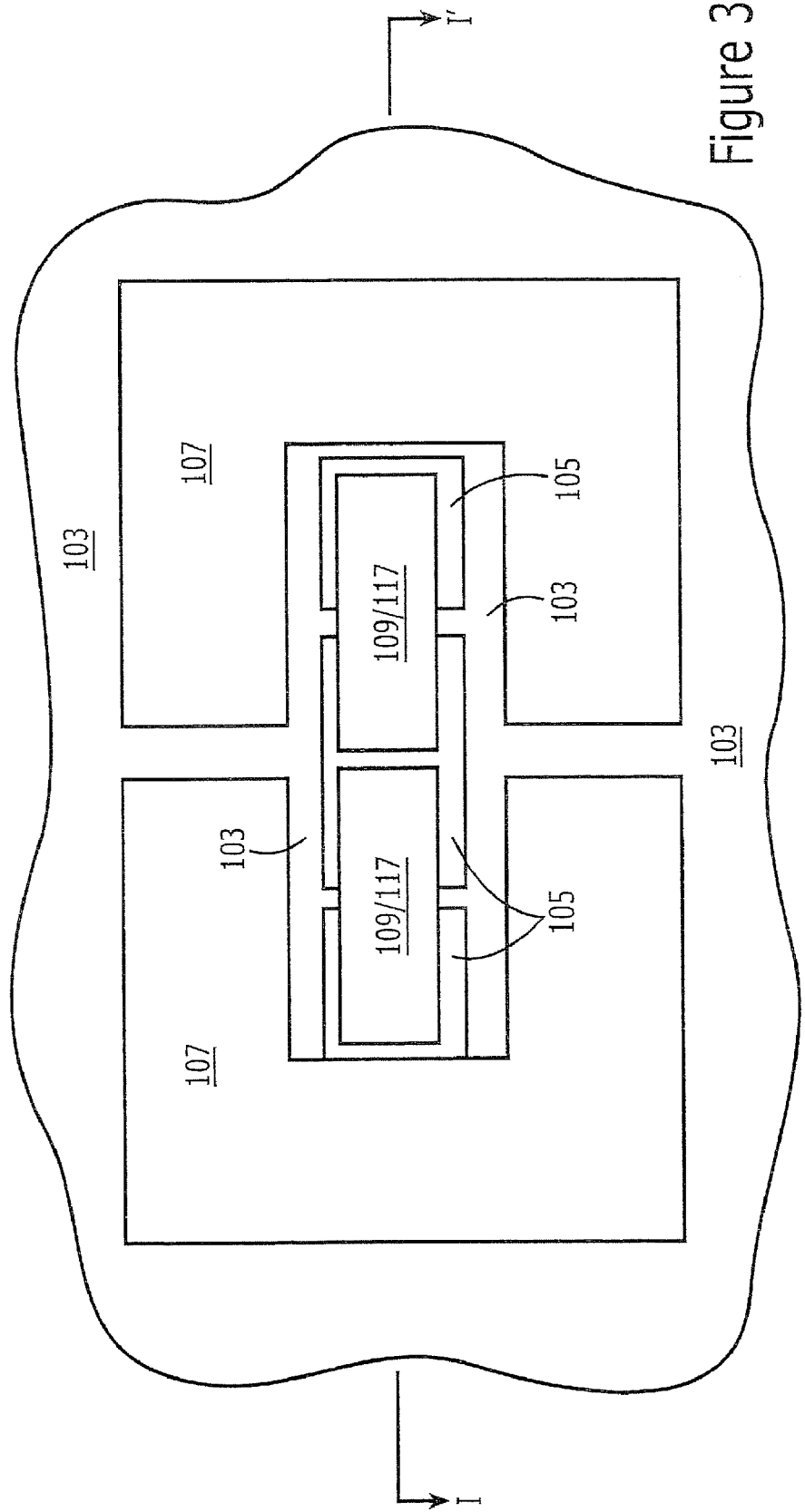
FIGS. 3 and 4 are plan views respectively illustrating structures of FIGS. 1B and 2B according to embodiments of the present invention, such that the cross-section of FIG. 1B is taken along section line I-I' and such that the cross-section of FIG. 2B is taken along section line II-II'.
Figure 4:
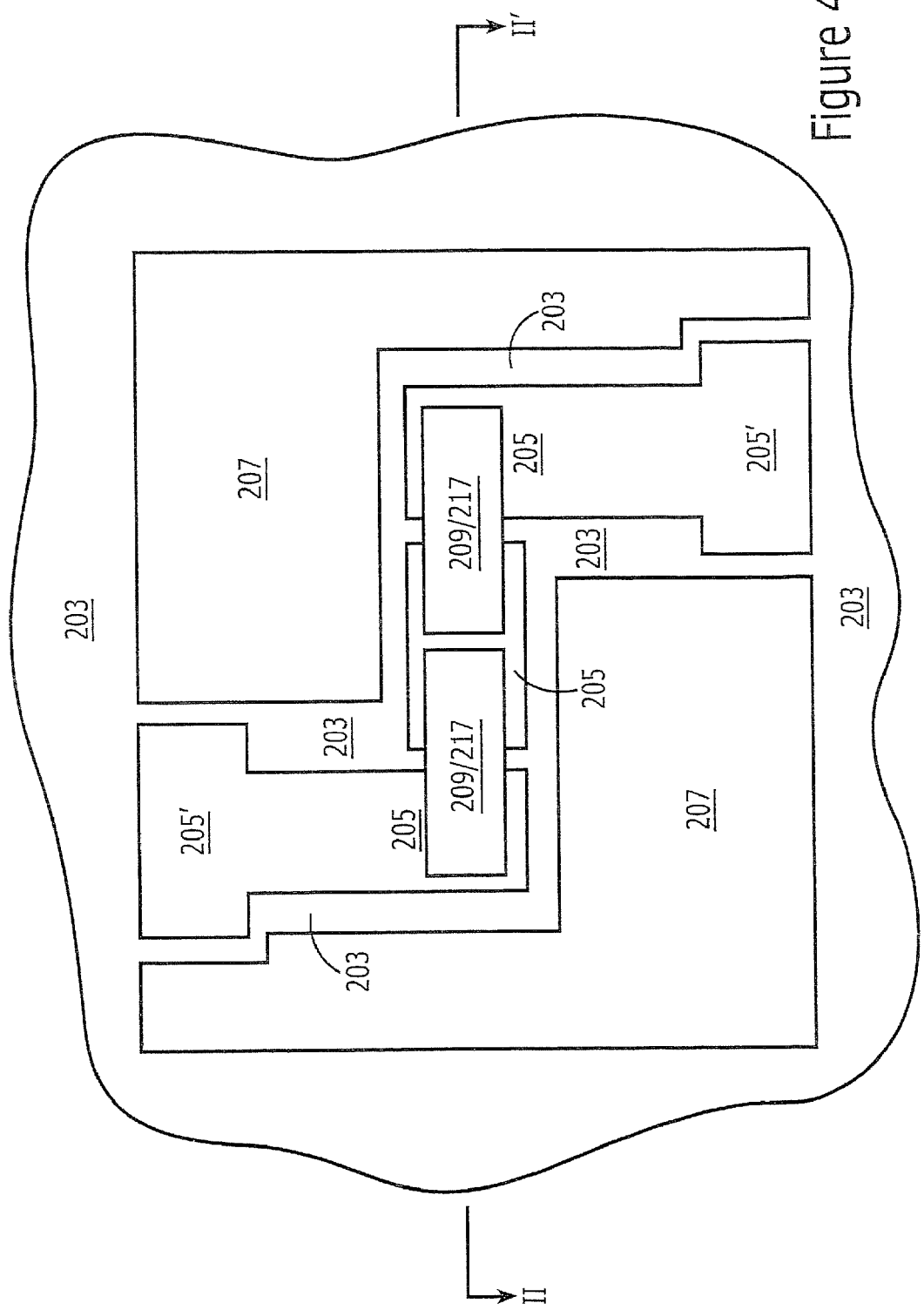

FIGS. 1A-C and 2A-C are cross-sectional views illustrating steps of embedding TEC devices on contact surfaces of respective substrates (either heat spreaders or IC chips) according to some embodiments of the present invention. FIG. 3 is a plan view of the resulting structure of FIG. 1B, and FIG. 4 is a plan view of the resulting structure of FIG. 2B. In FIGS. 1A-C, 2A-C, 3, and 4, only contact surfaces of the substrates are shown to more clearly illustrate the steps of providing embedded TEC devices thereon. According to some embodiments of the present invention, the illustrated substrates may be portions of lid-type heat spreaders configured to thermally contact a backside of a flip chip IC device and to be mechanically coupled to a printed circuit board (PCB) or another substrate to which the flip chip IC device is bonded. According to other embodiments of the present invention, the illustrated substrates may be portions of flip chip IC devices configured to contact a lid-type heat spreader. Heat spreader and/or IC device structures with embedded TEC devices and couplings therebetween will be discussed in greater detail below with respect to FIGS. 5A-D and 6A-B.

As shown in FIG. 1A, an insulating layer 103 may be formed on a substrate 101, and conductive traces 105 may be formed on the insulating layer 103 to provide electrical interconnection between thermoelectric p-n couples of a TEC device. The conductive traces 105, for example, may be formed by forming a metal layer (such as a copper layer) on the insulating layer 103 and photolithographically patterning the metal layer. The metal layer, for example, may be formed using evaporation, sputtering, etc. In alternative embodiments of the present invention, the conductive traces 105 may be formed using a lift-off technique and/or by selective plating (such as electroplating through a plating mask). The conductive traces 105, for example, may have a thickness in the range of about 5 μm (micrometers) to about 30 μm (micrometers).

By way of example, the substrate 101 shown in FIG. 1A may be a portion of a thermally conductive heat spreader, or the substrate 101 may be a portion of a backside of an IC chip. The insulating layer 103 may include a layer of a material such as silicon nitride, silicon oxide, aluminum oxide, and/or aluminum nitride. In alternative embodiments of the present invention, a separate insulating layer 103 may be omitted if the substrate 101 (or portions thereof) is electrically insulating.

As shown in FIG. 1B, a plurality of thermoelectric p-n couples 109 may be electrically, mechanically, and thermally coupled to the conductive traces 105, and a thermally conductive field 107 may be provided on the substrate 101 adjacent to the thermoelectric p-n couples 109. Each thermoelectric p-n couple 109 may include an n-type thermoelectric element 111-$n$, a p-type thermoelectric element 111-$p$, solder layers 115, and a conductive header 117 (such as a copper trace). Each thermoelectric element 111-$n$ and 111-$p$ may be electrically, mechanically, and thermally coupled to a respective conductive trace 105 using a respective solder layer 115. Moreover, each thermoelectric p-n couple 109 may be soldered as a unit on the substrate 101.

The thermally conductive field 107 may include a layer of a thermally conductive metal (such as copper and/or alloys thereof), and the thermally conductive field 107 may be formed by selective plating (such as electroplating). As shown in FIGS. 1B and 3, portions of the thermally conductive field 107 may be formed on portions of respective conductive traces 105. If the thermally conductive field 107 is electrically conductive, the thermoelectric p-n couples 109 may be electrically coupled in series between two different portions of the thermally conductive field 107. Moreover, the insulating layer 103 may provide that the separate portions of thermally conductive field 107 are not electrically shorted. Accordingly, electrical coupling used to power the TEC device (including thermoelectric p-n couples 109) may be provided through the thermally conductive field 107.

A thickness of the thermoelectric p-n couples 109 (including the electrically conductive traces 105, the solder layers 115, the thermoelectric elements 111-n and 111-p, and the conductive headers 117) may be in the range of about 50 μm (micrometers) thick to about 150 μm (micrometers) thick, and more particularly, in the range of about 70 μm (micrometers) thick to about 100 μm (micrometers) thick. Moreover, a thickness of the thermally conducive field 107 (including the electrically conductive traces 105 and the thermally conductive field 107) may be substantially the same as the thickness of the thermoelectric p-n couples 109. According to some embodiments of the present invention, a thickness of the thermally conductive field 107 may be slightly less than a thickness of the thermoelectric p-n couples 109. In other words, a surface of the thermally conductive field 107 opposite the substrate may be recessed relative to surfaces of the conductive headers 117 opposite the substrate. According to some other embodiments of the present invention, a thickness of the thermally conductive field 107 may be slightly greater than a thickness of the thermoelectric p-n couples 109. In other words, surfaces of the conductive headers 117 opposite the substrate may be recessed relative to surfaces of the conductive field 107 opposite the substrate.

According to some embodiments of the present invention, the thermally conductive field 107 may be formed on the substrate 101 before coupling the thermoelectric p-n couples 109 to the substrate 101. Accordingly, the thermally conductive field 107 may be formed more easily with reduced risk of damaging the thermoelectric p-n couples 109. In alternative embodiments of the present invention, the thermoelectric p-n couples 109 may be coupled to the substrate 101 before forming the thermally conductive field 107 so that the thermally conductive field 107 does not interfere with coupling of the thermoelectric p-n couples 109.

According to some embodiments of the present invention, the substrate 101 may be defined to include the thermally conductive field 107, and a recess in the substrate may be defined as portions of the substrate 101 that are free of the conductive field 107. Sidewalls of the thermally conductive field 107 may thus define sidewalls of the recess, and portions of the substrate 101 that are free of the thermally conductive field 107 may define a bottom surface of the recess. While the recess of FIG. 1B may be formed by selectively plating the thermally conductive field 107, the recess may be formed by selectively removing portions of a metal layer to provide the thermally conductive field 107 and/or by selectively removing portions of the substrate 101.

Figure 1C:
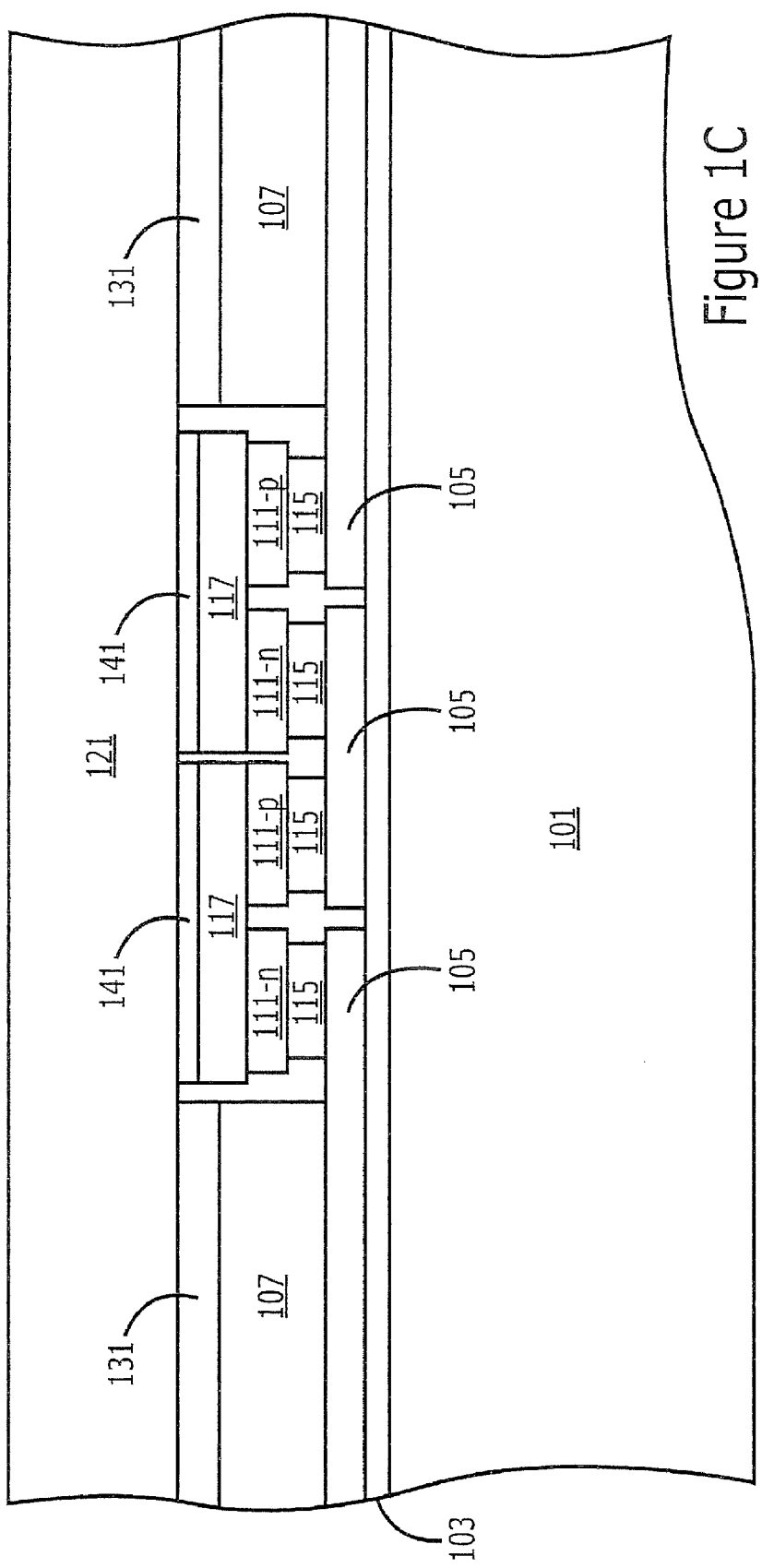

As shown in FIG. 1C, the thermally conductive field 107 and the conductive headers 117 may be thermally coupled with a second substrate 121 using thermal interface material (TIM) layers 131 and 141. According to some embodiments of the present invention, the TIM layers 131 may include a layer of a metal (such as an indium and/or indium alloy solder and/or a reactive foil) to provide thermal and mechanical coupling between the thermally conductive field 107 and the second substrate 121, while the TIM layers 141 may include a compliant thermal interface material (such as a thermal epoxy, a phase change material, a thermally conductive grease, and/or a thermally conductive paste) to provide thermal coupling between the conductive headers 117 and the second substrate 121. According to some other embodiments of the present invention, the TIM layers 131 may include a layer of a compliant thermal interface material (such as a thermal epoxy, a phase change material, a grease, and/or a paste), and the TIM layers 141 may include a layer of a metal (such as indium and/or an indium alloy solder and/or a reactive foil).

By providing different thermal interface materials for the layers 131 and 141, a thickness of thermal couplings (provided using TIM layers 141) between the conductive headers 117 and the second substrate 121 may be reduced thus improving a thermal coupling therebetween, while sufficient mechanical coupling between the first and second substrates 101 and 121 is provided using solder for the TIM layers 131. Stated in other words, a thickness of the TIM layers 141 may be less than a minimum bond line thickness (BLT) that may be required for solid TIM layers 131. Accordingly, an upper surface of the thermally conductive field 107 may be offset relative to (i.e. lower than) upper surfaces of the conductive headers 117.

The first substrate 101 may be a portion of a thermally conductive heat spreader (such as a lid-type copper heat spreader), and the second substrate 121 may be a portion of an IC flip chip semiconductor substrate. The TEC device including thermoelectric p-n couples 109 may thus be aligned with a hot spot of the second substrate 121 to provide active heat transfer from the second substrate 121 to the first substrate 101. In alternative embodiments of the present invention, the first substrate 101 may be a portion of an IC flip chip semiconductor substrate, and the second substrate 121 may be a portion of a thermally conductive heat spreader (such as a lid-type copper heat spreader). The TEC device including thermoelectric p-n couples 109 may thus be aligned with a hot spot of the first substrate 101 to provide active heat transfer from the first substrate 101 to the second substrate 121. In either example, the thermally conductive field 107 provides passive heat transfer between the two substrates 101 and 121.

While not shown in FIG. 1C, portions of the thermally conductive field 107 may extend beyond the second substrate 121 to provide electrical coupling from the TEC device, for example, to another substrate. In alternative embodiments of the present invention, electrical coupling of the TEC device may be provided through the thermally conductive field 107 and TIM layers 131 to traces on the second substrate 121. Moreover, electrically insulating layers on upper surfaces of conductive headers 117 and/or on the lower surface of the second substrate 121 may provide electrical isolation between the conductive headers 117 and the second substrate 121. Such electrically insulating layers may not be required if the lower surface of the second substrate 121 is otherwise electrically insulating and/or if the TIM layers 141 are electrically insulating.

Figure 2A:
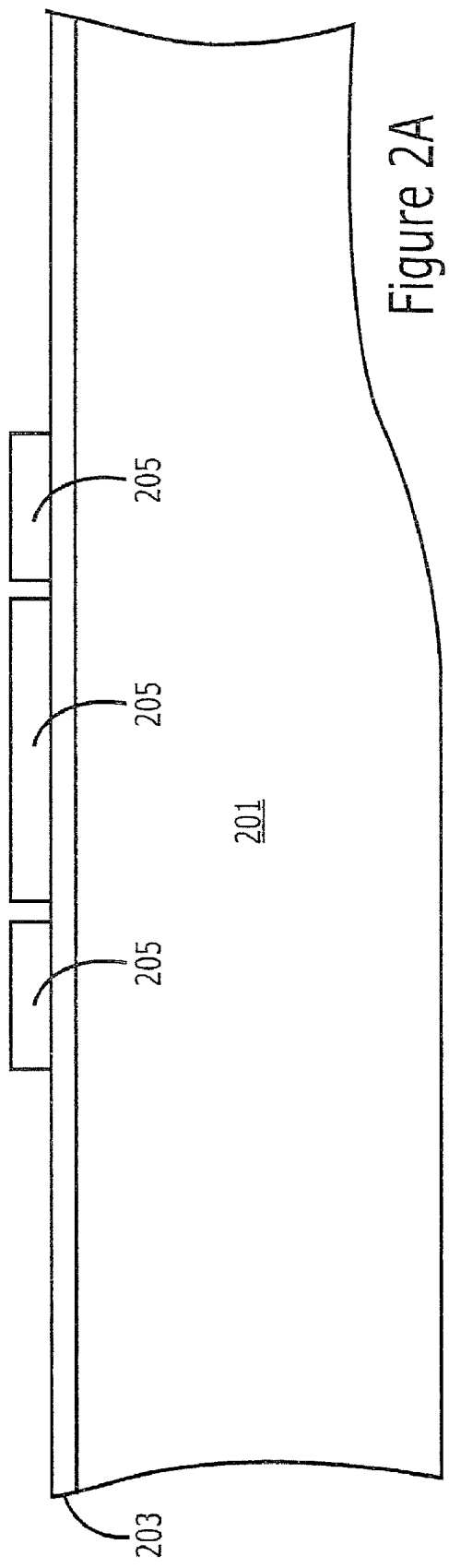

As shown in FIG. 2A, an insulating layer 203 may be formed on a substrate 201, and conductive traces 205 may be formed on the insulating layer 203 to provide electrical interconnection between thermoelectric p-n couples of a TEC device. The conductive traces 205, for example, may be formed by forming a metal layer (such as a copper layer) on the insulating layer 203 and photolithographically patterning the metal layer. The metal layer, for example, may be formed using evaporation, sputtering, etc. In alternative embodiments of the present invention, the conductive traces 205 may be formed using a lift-off technique and/or by selective plating (such as electroplating through a plating mask). The conductive traces 205, for example, may have a thickness in the range of about 5 μm (micrometers) to about 30 μm (micrometers).

By way of example, the substrate 201 shown in FIG. 2A may be a portion of a thermally conductive heat spreader, or the substrate 201 may be a portion of a backside of an IC chip. The insulating layer 203 may include a layer of a material such as silicon nitride, silicon oxide, aluminum oxide, and/or aluminum nitride. In alternative embodiments of the present invention, a separate insulating layer 203 may be omitted if the substrate 201 (or portions thereof) is electrically insulating.

Figure 2B:
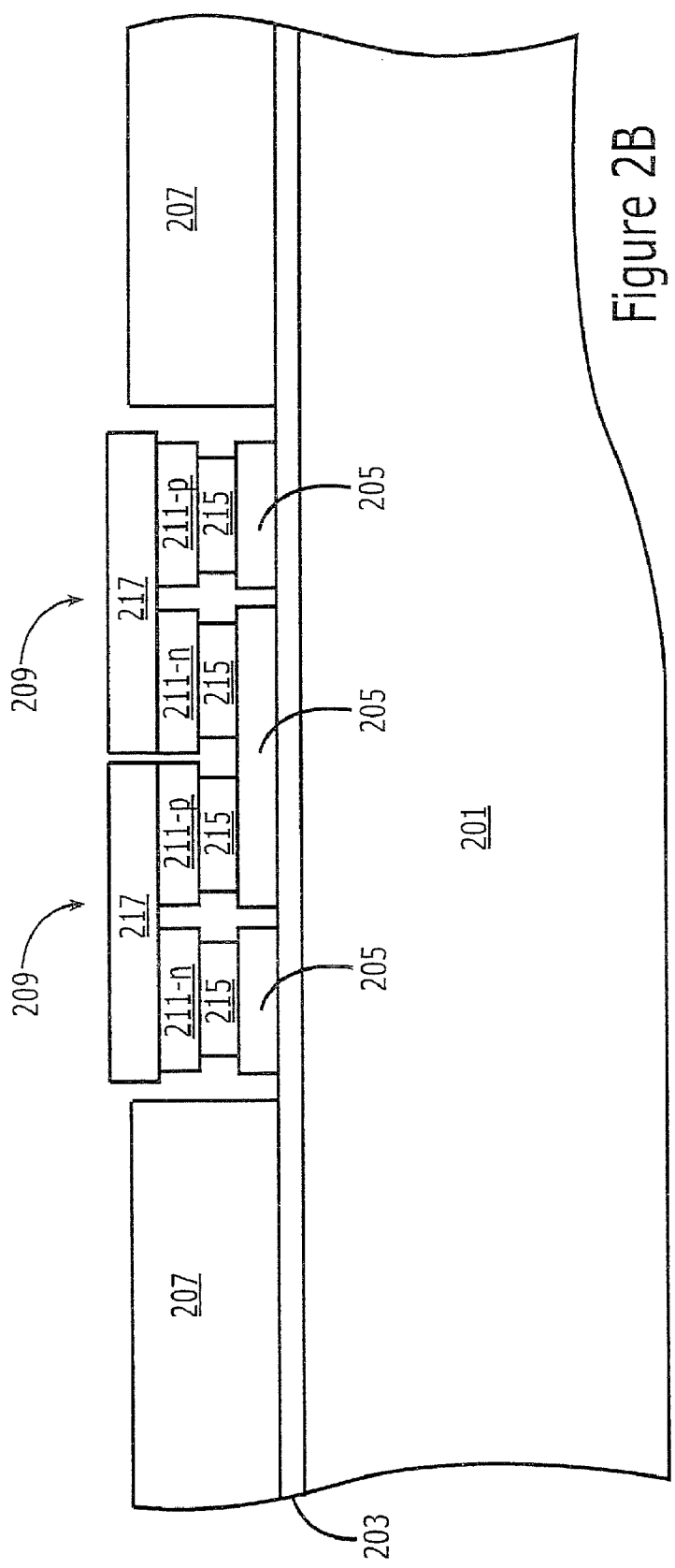

As shown in FIG. 2B, a plurality of thermoelectric p-n couples 209 may be electrically, mechanically, and thermally coupled to the conductive traces 205, and a thermally conductive field 207 may be provided on the substrate 201 adjacent to the thermoelectric p-n couples 209. Each thermoelectric p-n couple 209 may include an n-type thermoelectric element 211-n, a p-type thermoelectric element 211-p, solder layers 215, and a conductive header 217 (such as a copper trace). Each thermoelectric element 211-n and 211-p may be electrically, mechanically, and thermally coupled to a respective conductive trace 205 using a respective solder layer 215. Moreover, each thermoelectric p-n couple 209 may be soldered as a unit on the substrate 201.

The thermally conductive field 207 may include a layer of a thermally conductive metal (such as copper and/or alloys thereof), and the thermally conductive field 207 may be formed by selective plating (such as electroplating). As shown in FIGS. 2B and 4, the thermally conductive field 207 may be electrically isolated from the conductive traces 205. More particularly, the insulating layer 203 may provide that the conductive traces 205 are not electrically shorted to each other or to the thermally conductive field 207. Moreover, electrical coupling used to power the TEC device (including thermoelectric p-n couples 209) may be provided through pad portions 205' of the conductive traces 205 such that the thermoelectric p-n couples 209 are electrically coupled in series between the pad portions 205'. While the insulating layer 203 is shown between the thermally conductive field 207 and the substrate 201, portions of the insulating layer 203 between the thermally conductive field 207 and the substrate 201 may be omitted.

A thickness of the thermoelectric p-n couples 209 (including the electrically conductive traces 205, the solder layers 215, the thermoelectric elements 211-n and 211-p, and the conductive headers 217) may be in the range of about 50 μm (micrometers) thick to about 150 μm (micrometers) thick, and more particularly, in the range of about 70 μm (micrometers) thick to about 100 μm (micrometers) thick. Moreover, a thickness of the thermally conducive field 207 may be substantially the same as the thickness of the thermoelectric p-n couples 209. According to some embodiments of the present invention, a thickness of the thermally conductive field 207 may be slightly less than a thickness of the thermoelectric p-n couples 209. In other words, a surface of the thermally conductive field 207 opposite the substrate may be recessed relative to surfaces of the conductive headers 217 opposite the substrate. According to some other embodiments of the present invention, a thickness of the thermally conductive field 207 may be slightly greater than a thickness of the thermoelectric p-n couples 209. In other words, surfaces of the conductive headers 217 opposite the substrate may be recessed relative to surfaces of the conductive field 207 opposite the substrate.

According to some embodiments of the present invention, the thermally conductive field 207 may be formed on the substrate 201 before coupling the thermoelectric p-n couples 209 to the substrate 201. Accordingly, the thermally conductive field 207 may be formed more easily with reduced risk of damaging the thermoelectric p-n couples 209. In alternative embodiments of the present invention, the thermoelectric p-n couples 209 may be coupled to the substrate 201 before forming the thermally conductive field 207 so that the thermally conductive field 207 does not interfere with coupling of the thermoelectric p-n couples 209.

According to some embodiments of the present invention, the substrate 201 may be defined to include the thermally conductive field 207, and a recess in the substrate may be defined as portions of the substrate 201 that are free of the conductive field 207. Sidewalls of the thermally conductive field 207 may thus define sidewalls of the recess, and portions of the substrate 201 that are free of the thermally conductive field 207 may define a bottom surface of the recess. While the recess of FIG. 1B may be formed by selectively plating the thermally conductive field 207, the recess may be formed by selectively removing portions of a metal layer to provide the thermally conductive field 207 and/or by selectively removing portions of the substrate 201.

Figure 2C:
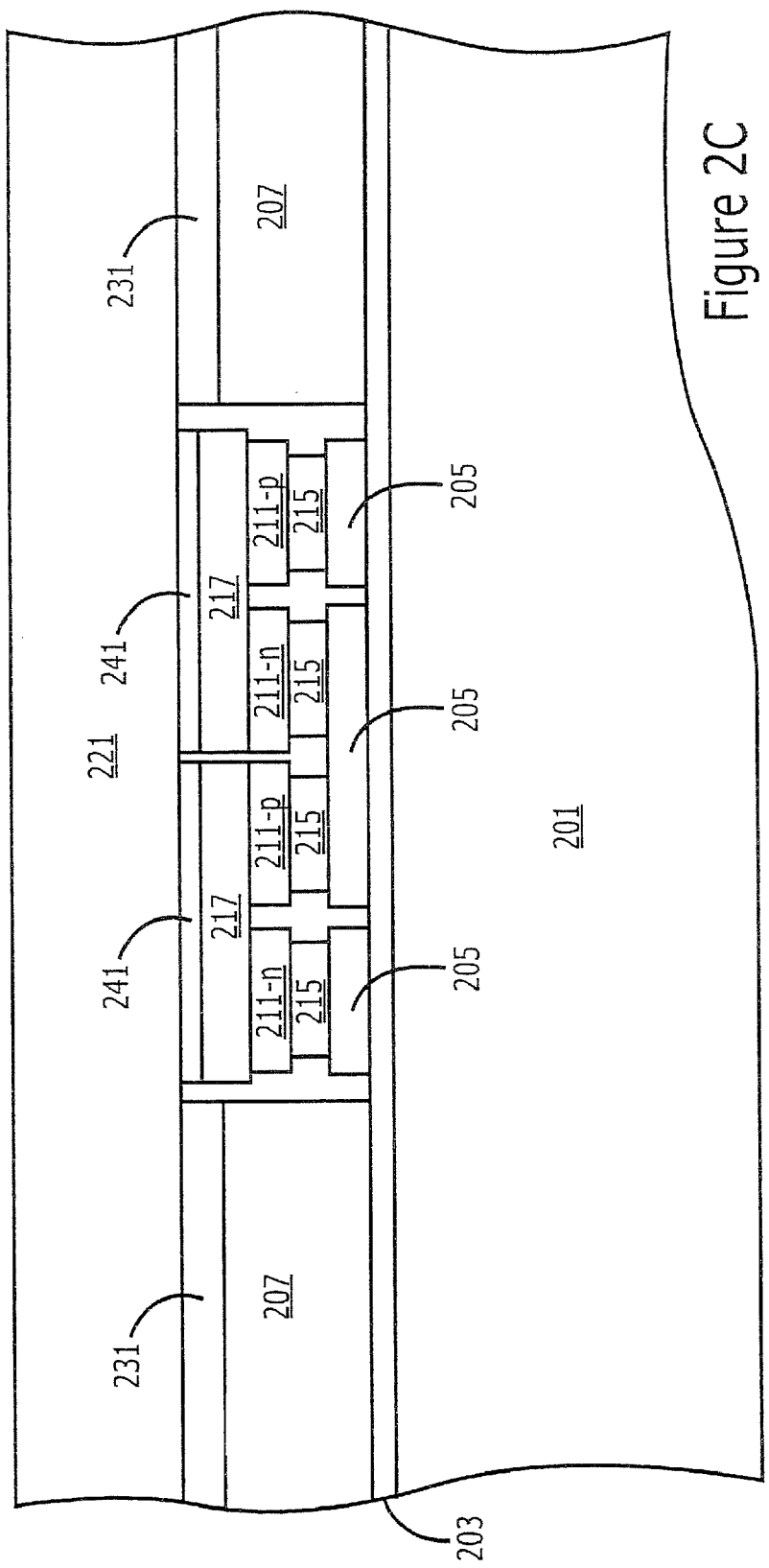

As shown in FIG. 2C, the thermally conductive field 207 and the conductive headers 217 may be thermally coupled with a second substrate 221 using thermal interface material (TIM) layers 231 and 241. According to some embodiments of the present invention, the TIM layers 231 may include a layer of a metal (such as an indium and/or indium alloy solder and/or a reactive foil) to provide thermal and mechanical coupling between the thermally conductive field 207 and the second substrate 221, while the TIM layers 241 may include a layer of a compliant thermal interface material (such as a thermal epoxy, a phase change material, a thermally conductive grease, and/or a thermally conductive paste) to provide thermal coupling between the conductive headers 217 and the second substrate 221. According to some other embodiments of the present invention, the TIM layers 231 may include a layer of a compliant dielectric material (such as a thermal epoxy, a phase change material, a grease, and/or a paste), and the TIM layers 241 may include a layer of a metal (such as an indium and/or an indium alloy solder and/or a reactive foil).

By providing different thermal interface materials for the layers 231 and 241, a thickness of thermal couplings (provided using TIM layers 241) between the conductive headers 217 and the second substrate 221 may be reduced thus improving a thermal coupling therebetween, while sufficient mechanical coupling between the first and second substrates 201 and 221 is provided using solder for the TIM layers 231. Stated in other words, a thickness of the TIM layers 241 may be less than a minimum bond line thickness (BLT) that may be required for solid TIM layers 231. Accordingly, an upper surface of the thermally conductive field 207 may be offset relative to (i.e., lower than) upper surfaces of the conductive headers 217.

The first substrate 201 may be a portion of a thermally conductive heat spreader (such as a lid-type copper heat spreader), and the second substrate 221 may be a portion of an IC flip chip semiconductor substrate. The TEC device including thermoelectric p-n couples 209 may thus be aligned with a hot spot of the second substrate 221 to provide active heat transfer from the second substrate 221 to the first substrate 201. In alternative embodiments of the present invention, the first substrate 201 may be a portion of an IC flip chip semiconductor substrate, and the second substrate 221 may be a portion of a thermally conductive heat spreader (such as a lid-type copper heat spreader). The TEC device including thermoelectric p-n couples 209 may thus be aligned with a hot spot of the first substrate 201 to provide active heat transfer from the first substrate 201 to the second substrate 221. In either example, the thermally conductive field 207 provides passive heat transfer between the two substrates 201 and 221.

While not shown in FIG. 2C, the pad portions 205' of the conductive traces 205 may extend beyond the second substrate 221 to provide electrical coupling from the TEC device, for example, to another substrate. In alternative embodiments of the present invention, electrical coupling of the TEC device may be provided through the pad portions 205' of the conductive traces 205 to traces on the second substrate 221. Moreover, electrically insulating layers on upper surfaces of conductive headers 217 and/or on the lower surface of the second substrate 221 may provide electrical isolation between the conductive headers 217 and the second substrate 221. Such electrically insulating layers may not be required if the lower surface of the second substrate 221 is otherwise electrically insulating and/or if the TIM layers 241 are electrically insulating.

While FIGS. 1A-C and 3 and FIGS. 2A-C and 4 illustrate a single TEC device including two thermoelectric p-n couples 109/209, by way of example, any number of embedded TEC devices including any number of p-n couples may be provided on a substrate 101/201 with a thermally conductive field 107/207 according to embodiments of the present invention. Accordingly, multiple hot spots on a same IC flip chip device may be actively cooled using separate TEC devices while remaining portions of the IC flip chip device may be passively cooled using the thermally conductive field. Moreover, a plurality of TEC devices on a same substrate may be electrically coupled in series so that one pair of input/output couplings may provide power to the plurality of TEC devices. In alternative embodiments of the present invention, separate input/output couplings may be provided for separate TEC devices on a same substrate so that the separate TEC devices may be separately powered and/or controlled. Moreover, an underfill (such as an epoxy based underfill) may be provided in interstices in/between p-n couples 109/209. Such an underfill may be electrically and thermally insulating, and/or may be applied using capillary forces.

Fabrication and assembly of thermoelectric p-n couples 109/209 is discussed, for example, in U.S. Provisional Patent App. No. 60/779,210, in U.S. Utility patent application Ser. No. 11/472,913, and U.S. Utility patent application Ser. No. 11/472,032, the disclosures of which are hereby incorporated herein in their entirety by reference. While not shown in FIGS. 1B and/or 2B, each thermoelectric p-n couple 109/209 may be provided with a sacrificial substrate (such as a sacrificial semiconductor substrate) on the respective conductive header 117/217 opposite the thermoelectric elements 111-*n*/211-*n* and 111-*p*/211-*p*. After soldering the thermoelectric elements to the respective conductive traces 105/205, the sacrificial substrate may be selectively removed (for example, using a selective etch) so that the thermoelectric p-n couples 109/209 remain as shown in FIGS. 1B and/or 2B.

In alternative embodiments of the present invention, the p-type and n-type thermoelectric elements may be bonded to respective traces 105/205, and then, the conductive headers 117/217 may be bonded thereto. For example, the conductive headers 117/217 may be soldered to the p-type and n-type thermoelectric elements before bonding the second substrate 121/221, or the conductive headers 117/217 may be provided on the second substrate 121/221 and soldered to the p-type and n-type thermoelectric elements when the second substrate 121/221 is bonded to the thermally conductive field 107/207.

The thermoelectric p-n couples 109/209 may also include other elements such as: solder layers between the thermoelectric elements and the conductive headers 117/217; barrier/passivation/wettable metal layers between solder layers and thermoelectric elements; metal posts (such as copper posts) above and/or below the thermoelectric elements; etc.

As discussed above with respect to FIGS. 1A-C, 2A-C, 3, and 4, an upper surface of the thermally conductive field 107/207 may be recessed relative to upper surfaces of the conductive headers 117. According to other embodiments of the present invention, the upper surfaces of the thermally conductive field 107/207 may be substantially co-planar. After forming the thermally conductive field 107/207 and bonding the thermoelectric p-n couples 109/209, an electrically insulating underfill material (such as an epoxy underfill material) may be provided between the thermoelectric elements and between the conductive headers 117/217 and the substrate 101/201. The underfill material may thus increase a structural integrity of the structure.

Once the underfill material has been cured, upper surfaces of the thermally conductive field 107/207 and/or the conductive headers 117/217 and/or portions of the underfill material therebetween may be polished to provide that these surfaces are substantially coplanar. A thin insulating layer (such as a layer of silicon oxide, silicon nitride, aluminum oxide, aluminum nitride, etc.) may then be formed on surfaces of the thermally conductive field 107/207 and the conductive headers 117/217 and portions of the underfill material therebetween to provide electrical isolation of the conductive headers 117/217. Then, a thin metal layer may be formed on the thin insulating layer to enhance thermal conduction with the second substrate 121/221.

With surfaces of the thermally conductive field 107/207 and the conductive headers 117/217 being coplanar, a continuous layer of a thermal interface material (having a relatively uniform thickness) may be provided between the thermally conductive field 107/207 and second substrate 121/221 and between the conductive headers 117/217 and the second substrate 121/221. If a polishing operation is performed, the thermally conductive field 107/207 may be formed to a thickness of about 115 μm (micrometers) and then polished to a thickness of about 100 μm (micrometers).

Figure 5A:
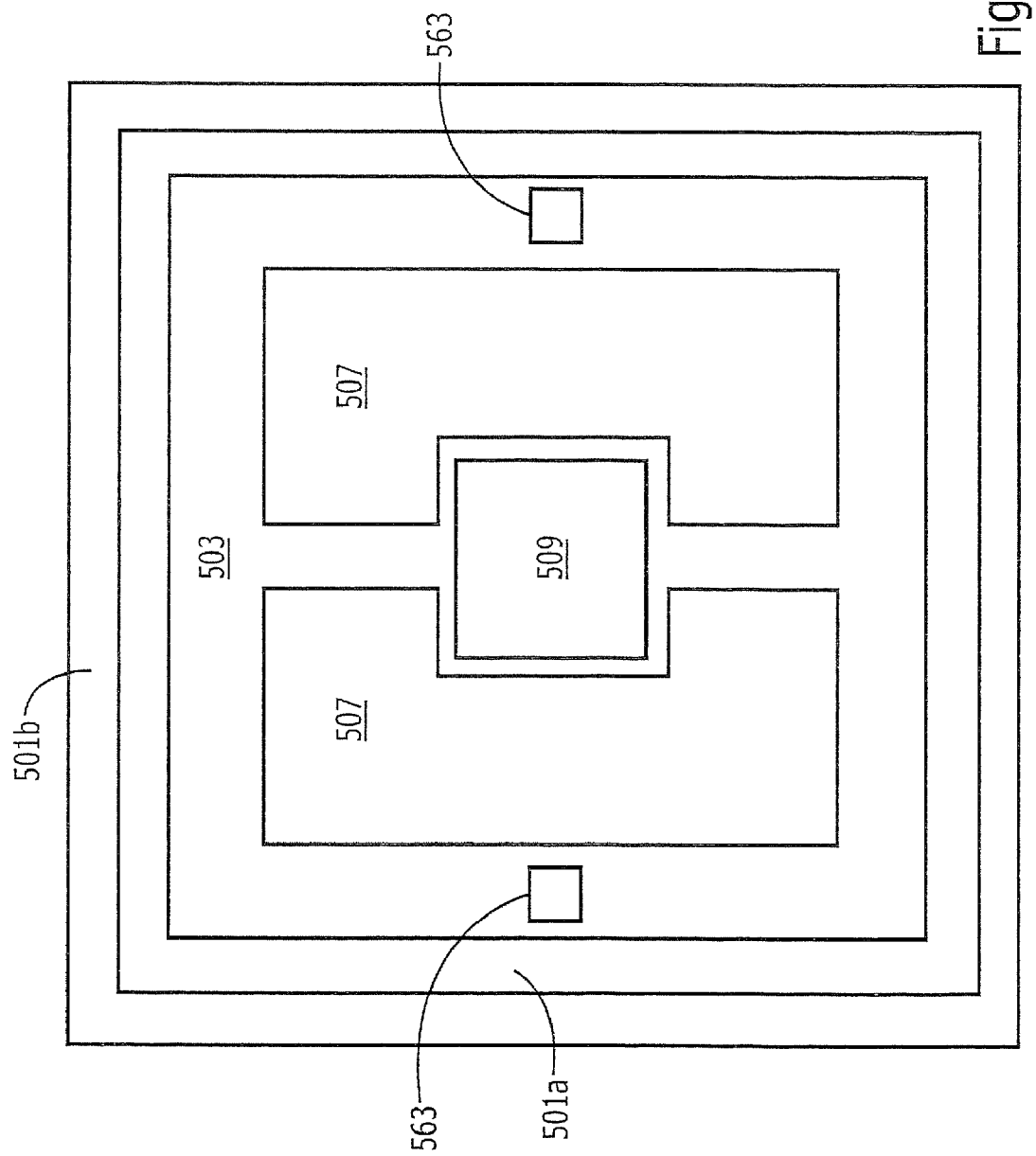
FIGS. 5A-B are plan and cross-sectional views illustrating thermoelectric coolers embedded on heat spreaders according to embodiments of the present invention.
Figure 5B:
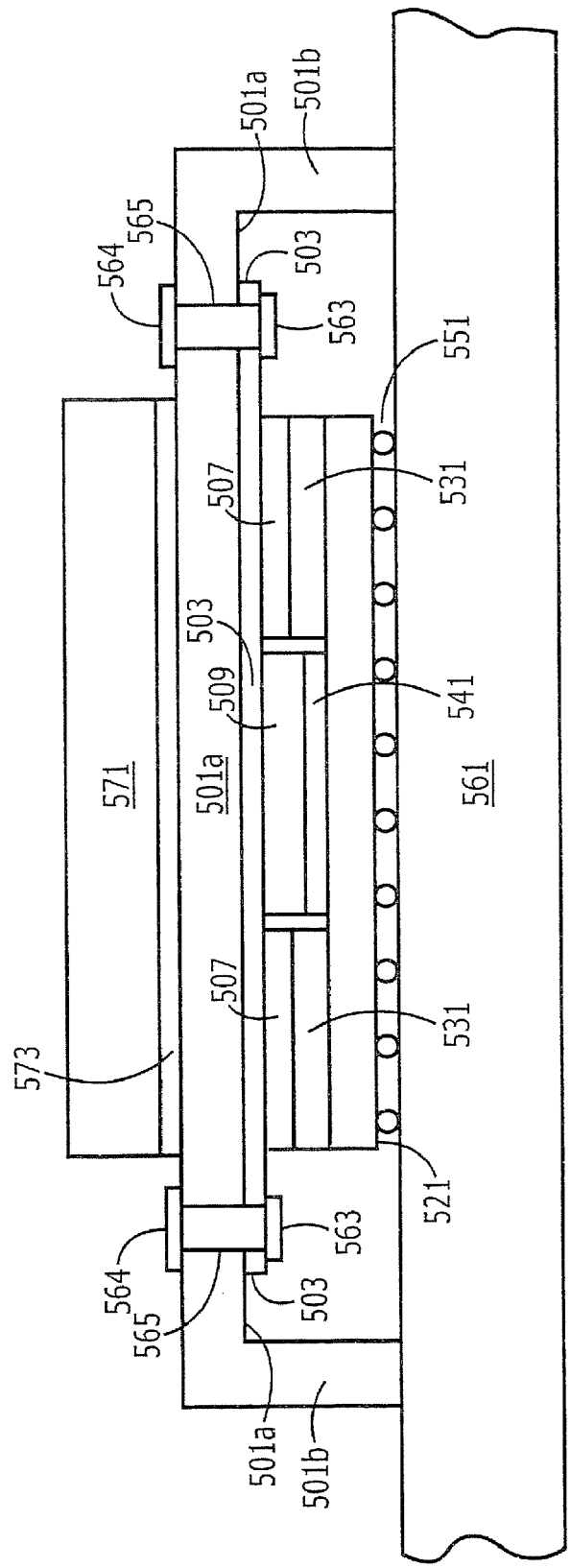
Figure 5D:
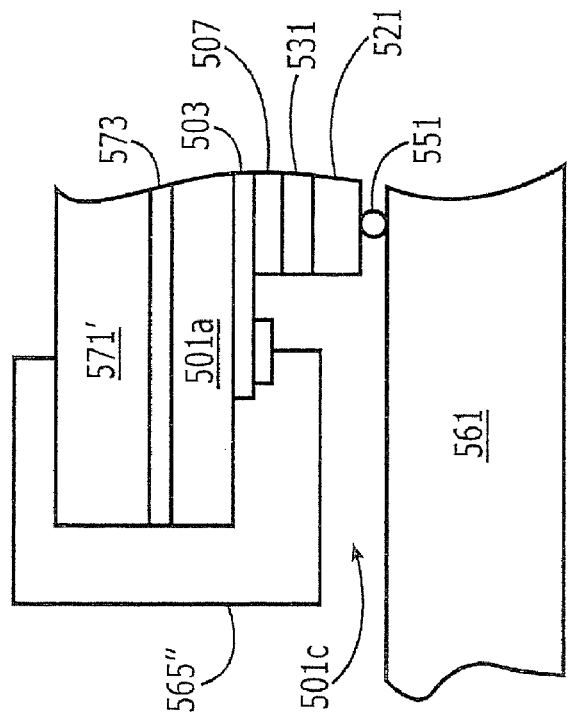
FIGS. 5C-D are cross-sectional views illustrating wirebonds and clips according to embodiments of the present invention.

Examples of heat spreaders including embedded thermoelectric devices according to embodiments of the present invention are illustrated in FIGS. 5A-D. As shown in FIGS. 5A-B, a lid type heat spreader according to embodiments of the present invention may include a substantially planar substrate portion 501*a* and support portions 501*b* that may be stamped, molded, or otherwise formed from a thermally conductive material. More particularly, the substrate portion 501*a* and the support portions 501*b* may be formed from a metal such as copper and/or alloys thereof. Moreover, the substrate portion 501*a* may be implemented, for example, as the substrate 101 of FIGS. 1A-C and 3 and/or as the substrate 201 of FIGS. 2A-C and 4.

An electrically insulating layer 503 may be provided on the substrate portion 501*a* of the heat spreader, and a thermally conductive field(s) 507 and a TEC device 509 (including a plurality of thermoelectric p-n couples) may be provided on the electrically insulating layer 503. The electrically insulating layer 503 and the thermally conductive field(s) 507 may be implemented, for example, as the insulating layer 103 and the thermally conductive field 107 of FIGS. 1A-C and 3 and/or as the insulating layer 203 and the thermally conductive field 207 of FIGS. 2A-C and 4. Moreover, the TEC device 509 may be implemented as a plurality of thermoelectric p-n couples including electrically conductive traces 105, solder layers 115, thermoelectric elements 111-*n* and 111-*p*, and electrically conductive headers 117 as shown in FIGS. 1A-C and 3, or including electrically conductive traces 205, solder layers 215, thermoelectric elements 211-n and 211-p, and electrically conductive headers 217 as shown in FIGS. 2A-C and 4.

While TEC devices including two serially connected thermoelectric p-n couples are illustrated herein by way of example, the TEC device 509 of FIGS. 5A-B may include any number of thermoelectric p-n couples, and/or multiple TEC devices may be provided on the substrate portion 501a of the heat spreader. Moreover, the TEC device 509 is shown in block diagram form for ease of illustration, but it will be understood that the TEC device 509 may include pluralities of electrically conductive traces, solder layers, p-type and n-type thermoelectric elements, and/or electrically conductive headers.

As further shown in FIGS. 5A and 5B, an IC flip chip device 521 may be electrically and mechanically coupled to a packaging substrate 561 (such as a printed circuit board), for example, using solder bumps 551. In addition, support portions 501b of the lid-type heat spreader may be mechanically coupled to the packaging substrate 561 (for example, using solder and/or epoxy), and the thermally conductive field(s) 507 and the TEC device 509 may be thermally coupled to a backside of the IC device 521 substrate. More particularly, a solid thermal interface material (TIM) layer 531 (such as a layer of solder or a reactive foil) may provide thermal and mechanical coupling between the thermally conductive field, and a compliant thermal interface material (TIM) layer 541 (such as a layer of a thermally conductive grease or paste) may provide thermal coupling between the TEC device 509 and a hot spot of the IC device 521. According to some embodiments of the present invention, the TIM layer 531 may include a layer of a metal (such as an indium and/or indium alloy solder and/or a reactive foil), and the TIM layer 541 may include a layer of a compliant TIM material (such as a thermal epoxy, a phase change material, a thermally conductive paste, and/or a thermally conductive grease). According to some other embodiments of the present invention, the TIM layer 541 may include a layer of a metal (such as an indium and/or indium alloy solder and/or a reactive foil), and the TIM layer 531 may include a layer of a compliant TIM material (such as a thermal epoxy, a phase change material, a thermally conductive paste, and/or a thermally conductive grease). The IC device 521 may be implemented as a substrate 121/221, the TIM layer 531 may be implemented as a TIM layer 131/231, and/or the TIM layer 541 may be implemented as a TIM layer 141/241 as discussed above with respect to FIGS. 1A-C, 2A-C, 3, and 4.

While not shown in FIGS. 5A and 5B, electrical coupling for the TEC device 509 may be provided using electrically separated portions of the thermally conductive field 507 as discussed above with respect to the thermally conductive field 107 of FIGS. 1A-C and 3. For example, each of the electrically separated portions of the thermally conductive field 507 may extend on portions of the electrically insulating layer 503 beyond the IC device 521 to provide electrical connection to pads 563 for solder, wire, and/or other electrical interconnection. In other words, portions of the thermally conductive field(s) 507 may be electrically connected to the pads 563.

In alternative embodiments of the present invention, electrical coupling for the TEC device 509 may be provided using electrically conductive traces electrically separated from the thermally conductive field 507 as discussed above with respect to the electrically conductive traces 205 (including pad portions 205') of FIGS. 2A-C and 4. For example, the electrically conductive traces may extend on portions of the electrically insulating layer 503 beyond the IC device 521 to provide electrical connection to pads 563 for solder, wire, and/or other electrical interconnection. In other words, electrically conductive traces may extend from the TEC device 509 to the pads 563. The electrically conductive traces, for example, may extend between separate portions of the thermally conductive field 507, or the electrically conductive traces may extend above or below portions of the thermally conductive field 507 provided that electrically insulating layers are provided therebetween.

In addition, a separate cold plate 571 may be provided on the substrate portion 501a of the heat spreader, and a TIM layer 573 may be provided between the substrate portion 501a and the cold plate 571. The cold plate 571, for example, may include a heat sink, a condensation chamber, heat pipes, etc. The TIM layer 573 may include a solder, a reactive foil, a conductive paste, a conductive grease, etc. In alternative embodiments of the present invention, a separate cold plate may not be required. For example, fins for a heat sink may be integrated on a surface of the substrate portion 501a opposite the IC device 521.

As shown in FIG. 5B, conductive vias 565 may provide electrical coupling between the pads 563 (which are electrically connected to the TEC device 509) and conductive pads 564. From the pads 564, for example, wire bonds may provide electrical coupling to the substrate 561 and/or to another substrate. In alternative embodiments of the present invention, wire bonds or other electrical connection may be provided between the pads 563 and the substrate 561 inside the cavity defined by the substrate and support portions 501a and 501b of the heat spreader. In other alternative embodiments of the present invention, electrically conductive traces may extend on inside surfaces of the support portion 501b of the heat spreader between the TEC device 509 and the packaging substrate 561. If the substrate portion 501a of the heat spreader comprises an electrically conductive material (such as copper), the conductive vias 565 may be provided with an electrically insulating sheath (such as a layer of an insulating oxide) surrounding an electrically conductive core (such as a metal plug). If the substrate portion 501a of the heat spreader comprises an electrically insulating material (such as aluminum nitride), the conductive vias 565 may be provided without a separate insulating sheath. While not shown in FIG. 5B, the cold plate 571 may extend to and/or beyond edges of the heat spreader, for example, with the conductive vias 565 extending through the cold plate 571 and/or with conductive traces extending between the cold plate 571 and the heat spreader.

Figure 5C:
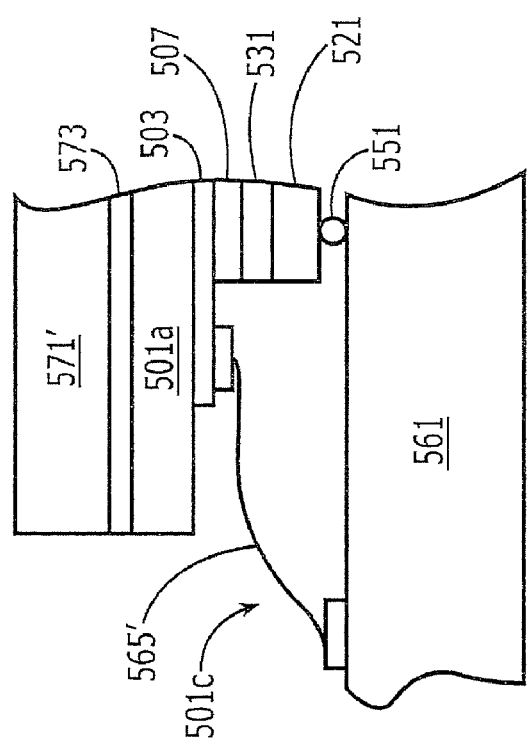

In still other alternative embodiments of the present invention, an opening 501c in the support portion 501b adjacent to a pad 563 may allow use of a wire interconnection 565' to a portion of the packaging substrate 561 outside the heat spreader as shown in FIG. 5C. While not shown in FIG. 5C, other portions of the support portion 501b may remain to support the heat spreader. Moreover, the cold plate 571' may extend across/beyond the heat spreader.

In yet other alternative embodiments of the present invention, an opening in the support portion 501b adjacent to a pad 563 may allow an interconnection 565" to an upper portion of the substrate portion 501a of the heat spreader (or a cold plate 571 thereon). The interconnection 565" of FIG. 5D, for example, may be provided using a conductive clip and/or electrically conductive traces on the substrate portion 501a. While not shown in FIG. 5D, other portions of the support portion 501b may remain to support the heat spreader.

Figure 6A:
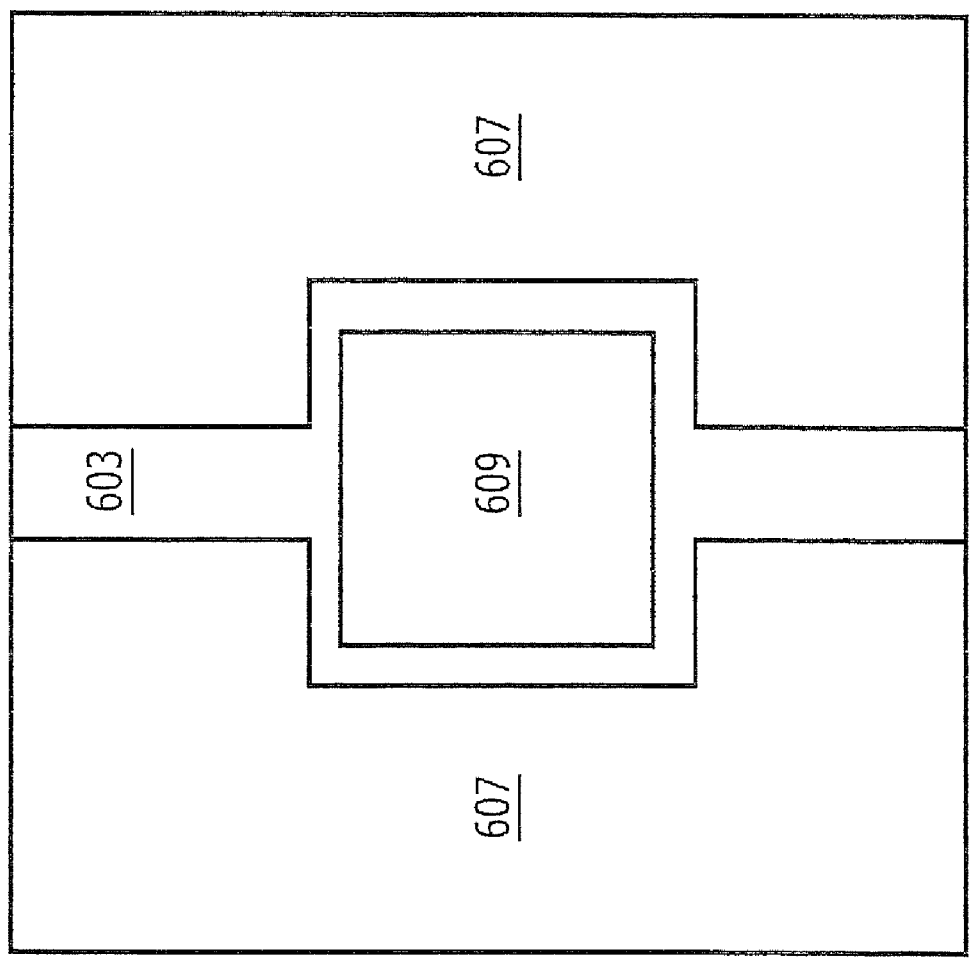
FIGS. 6A-B are plan and cross-sectional views illustrating thermoelectric coolers embedded on IC devices according to embodiments of the present invention.
Figure 6B:
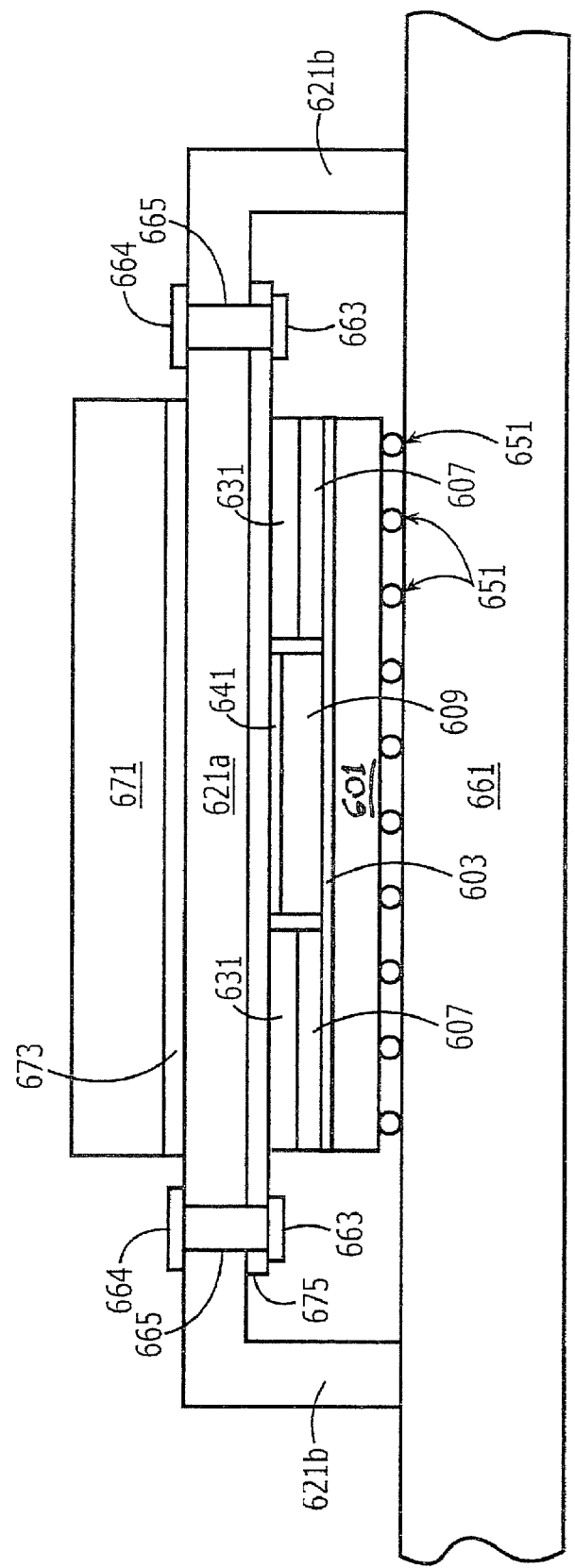

Examples of IC devices including embedded thermoelectric devices on backsides thereof according to embodiments of the present invention are illustrated in FIGS. 6A-B. As shown in FIGS. 6A and 6B, an IC flip chip device 601 may be electrically and mechanically coupled to a packaging substrate 661 (such as a printed circuit board), for example, using solder bumps 651. Moreover, a lid type heat spreader may include a substantially planar substrate portion 621a and support portions 621b that may be that may be stamped, molded, or otherwise formed from a thermally conductive material. More particularly, the substrate portion 621a and the support portions 621b may be formed from a metal such as copper and/or alloys thereof. By way of example, the IC device 601 may be implemented as the substrate 101/201 of FIGS. 1A-C, 2A-C, 3, and/or 4, and the substrate portion 621a of the heat spreader may be implemented as the substrate 121/221. Moreover, support portions 621b of the lid-type heat spreader may be mechanically coupled to the packaging substrate 661 (for example, using solder and/or epoxy).

An electrically insulating layer 603 may be provided on the backside of the IC device 601, and a thermally conductive field(s) 607 and a TEC device 609 (including a plurality of thermoelectric p-n couples) may be provided on the electrically insulating layer 603. The electrically insulating layer 603 and the thermally conductive field(s) 607 may be implemented, for example, as the insulating layer 103/203 and the thermally conductive field 107/207 of FIGS. 1A-C, 2A-C, 3, and 4. Moreover, the TEC device 609 may be implemented as a plurality of thermoelectric p-n couples including electrically conductive traces 105/205, solder layers 115/215, thermoelectric elements 111-n/211-n and 111-p/211-p, and electrically conductive headers 117/217 as shown in FIGS. 1A-C, 2A-C, 3 and 4.

While TEC devices including two serially connected thermoelectric p-n couples are illustrated herein by way of example, the TEC device 609 of FIGS. 6A-B may include any number of thermoelectric p-n couples, and/or multiple TEC devices may be provided on the backside of the IC device 601. Moreover, the TEC device 609 is shown in block diagram form for ease of illustration, but it will be understood that the TEC device 609 may include pluralities of electrically conductive traces, solder layers, p-type and n-type thermoelectric elements, and/or electrically conductive headers.

The thermally conductive field(s) 607 and the TEC device 609 may be thermally coupled to the substrate portion 621a of the heat spreader. More particularly, a solid thermal interface material (TIM) layer 631 (such as a solder layer or a reactive foil) may provide thermal and mechanical coupling between the thermally conductive field 607 and the substrate portion 621a of the heat spreader, and a compliant thermal interface material (TIM) layer 641 (such as a layer of a thermally conductive grease or paste) may provide thermal coupling between the TEC device 609 and the substrate portion 621a of the heat spreader. The IC device 601 may be implemented as a substrate 101/201, the TIM layer 631 may be implemented as a TIM layer 131/231, and/or the TIM layer 641 may be implemented as a TIM layer 141/241 as discussed above with respect to FIGS. 1A-C, 2A-C, 3, and 4.

While not shown in FIGS. 6A and 6B, electrical coupling for the TEC device 609 may be provided using electrically separated portions of the thermally conductive field 607 as discussed above with respect to the thermally conductive field 107 of FIGS. 1A-C and 3. For example, each of the electrically separated portions of the thermally conductive field 607 may provide electrical coupling through the TIM layers 631 to the substrate portion 621a of the heat spreader, and electrical traces on the heat spreader may provide electrical coupling between separated portions of the thermally conductive field 607 and the pads 663. The pads 663 may be electrically coupled to the packaging substrate 661, for example, using solder, wire, and/or other electrical interconnection. In other words, portions of the thermally conductive field(s) 607 may be electrically connected to the pads 663.

In alternative embodiments of the present invention, electrical coupling for the TEC device 609 may be provided using electrically conductive traces electrically separated from the thermally conductive field 607 as discussed above with respect to the electrically conductive traces 205 (including pad portions 205') of FIGS. 2A-C and 4. For example, pad portions 205' of the electrically conductive traces may be used to provide wire bonding to a substrate portion 621a of the heat spreader and/or to the packaging substrate 661. In other alternative embodiments of the present invention, pad portions 205' of the electrically conductive traces may be used to provide a solder interconnection to the substrate portion 621a of the heat spreader, and electrically conductive traces on the substrate portion 612a of the heat spreader may provide electrical coupling to pads 663.

In addition, a separate cold plate 671 may be provided on the substrate portion 621a of the heat spreader, and a TIM layer 673 may be provided between the substrate portion 621a of the heat spreader and the TIM layer 673. The cold plate 671, for example, may include a heat sink, a condensation chamber, heat pipes, etc. The TIM layer 673 may include a solder, a reactive foil, a conductive paste, a conductive grease, etc. In other alternative embodiments of the present invention, a separate cold plate may not be required. For example, fins for a heat sink may be integrated on a surface of the substrate portion 621a opposite the IC device 601.

As shown in FIG. 6B, conductive vias 665 may provide electrical coupling between the pads 663 (which may be electrically connected to the TEC device 609) and conductive pads 664. From the pads 664, for example, wire bonds may provide electrical coupling to the substrate 661 and/or to another substrate. In alternative embodiments of the present invention, wire bonds or other electrical connection may be provided between the pads 663 and the substrate 661 inside the cavity defined by the substrate and support portions 621a and 621b of the heat spreader. In other alternative embodiments of the present invention, electrically conductive traces may extend on inside surfaces of the support portion 621b of the heat spreader between the TEC device 609 and the packaging substrate 661. If the substrate portion 621a of the heat spreader comprises an electrically conductive material (such as copper), the conductive vias 665 may be provided with an electrically insulating sheath (such as a layer of an insulating oxide) surrounding an electrically conductive core (such as a metal plug). If the substrate portion 621a of the heat spreader comprises an electrically insulating material (such as aluminum nitride), the conductive vias 665 may be provided without a separate insulating sheath. While not shown in FIG. 6B, the cold plate 671 may extend to and/or beyond edges of the heat spreader, for example, with the conductive vias 665 extending through the cold plate 671 and/or with conductive traces extending between the cold plate 671 and the heat spreader.

In still other alternative embodiments of the present invention, an opening in the support portion 621b adjacent to a pad 663 may allow use of a wire interconnection to a portion of the packaging substrate 661 outside the heat spreader as discussed above with respect to FIG. 5C. In yet other alternative embodiments of the present invention, an opening in the support portion 621b adjacent to a pad 663 may allow an interconnection to an upper portion of the substrate portion 621a of the heat spreader (or a cold plate 671 thereon) using a conductive clip and/or electrically conductive traces as discussed above with respect to FIG. 5C.

While the present invention has been particularly shown and described with reference to embodiments thereof, it will be understood by those of ordinary skill in the art that various changes in form and details may be made therein without departing from the spirit and scope of the present invention as defined by the following claims. For example, embodiments of the present invention have been discussed above in the context of thermoelectric cooling for integrated circuit devices. In addition and/or in alternatives, thermoelectric devices and/or methods according to embodiments of the present invention may be used to provide thermoelectric cooling in applications other than integrated circuit devices, in thermoelectric power conversion applications, and/or in thermoelectric heating applications.

That which is claimed is:

1. A method of forming a thermoelectric device, the method comprising:
   providing a substrate having a surface;
   thermally coupling a thermoelectric p-n couple to a first portion of the surface of the substrate, wherein the thermoelectric p-n couple includes a p-type thermoelectric element and an n-type thermoelectric element; and
   plating a thermally conductive field layer on a second portion of the surface of the substrate adjacent the first portion of the surface of the substrate;
   wherein a thickness of the thermally conductive field layer is at least half of a thickness of the thermoelectric p-n couple, and wherein the thickness of the thermally conductive field layer is less than a thickness of the thermoelectric p-n couple.

2. A method according to claim 1 wherein plating the thermally conductive field layer comprises selectively plating the thermally conductive field layer on the second portion of the surface of the substrate without plating the thermally conductive field layer on the first portion of the surface of the substrate.

3. A method according to claim 1 wherein the thermally conductive field layer comprises a metal.

4. A method according to claim 3 wherein the thermally conductive field layer comprises copper.

5. A method according to claim 1 further comprising:
   after plating the thermally conductive field layer, providing a thermal coupling between the thermoelectric p-n couple and a second substrate and between the thermally conductive field layer and the second substrate, so that the p-type thermoelectric element and the n-type thermoelectric element are thermally coupled in parallel between the first and second substrates.

6. A method according to claim 5 wherein the first substrate comprises a semiconductor integrated circuit substrate and wherein the second substrate comprises a thermally conductive heat spreader.

7. A method according to claim 6 wherein the semiconductor integrated circuit substrate is bonded to a third substrate so that the semiconductor integrated circuit substrate is between the third substrate and the thermally conductive heat spreader, the method further comprising:
   bonding edges of the thermally conductive heat spreader to the third substrate.

8. A method according to claim 5 wherein the first substrate comprises a thermally conductive heat spreader and wherein the second substrate comprises a semiconductor integrated circuit substrate.

9. A method according to claim 8 wherein the semiconductor integrated circuit substrate is bonded to a third substrate so that the semiconductor integrated circuit substrate is between the third substrate and the thermally conductive heat spreader, the method further comprising:
   bonding edges of the thermally conductive heat spreader to the third substrate.

10. A method of forming a thermoelectric device, the method comprising:
    providing a substrate having a surface;
    thermally coupling a thermoelectric p-n couple to a first portion of the surface of the substrate, wherein the thermoelectric p-n couple includes a p-type thermoelectric element and an n-type thermoelectric element; and
    forming a thermally conductive metal field layer on a second portion of the surface of the substrate adjacent the first portion of the surface of the substrate;
    wherein forming the thermally conductive metal field layer comprises forming first and second thermally conductive metal field layers wherein the thermoelectric p-n couple is electrically coupled in series between the first and second thermally conductive metal field layers and wherein each of the first and second thermally conductive metal field layers has a thickness that is at least half of a thickness of the thermoelectric p-n couple.

11. A method according to claim 1 wherein the surface of the substrate comprises an electrically insulating material adjacent the p-n couple.

12. A method according to claim 1 wherein a first portion of the substrate adjacent the p-n couple comprises an electrically insulating material adjacent the p-n couple and wherein a second portion of the substrate adjacent the thermally conductive field layer is free of the electrically insulating material adjacent the thermally conductive field layer.

13. A method according to claim 1 wherein thermally coupling the thermoelectric p-n couple to the first portion of the surface comprises bonding the thermoelectric p-n couple to the first portion of the surface.

14. A method according to claim 1 wherein thermally coupling the thermoelectric p-n couple to the first portion of the surface of the substrate precedes forming the thermally conductive field layer.

15. A method of forming a thermoelectric device, the method comprising:
    providing a substrate having a surface;
    thermally coupling a thermoelectric p-n couple to a first portion of the surface of the substrate, wherein the thermoelectric p-n couple includes a p-type thermoelectric element and an n-type thermoelectric element; and
    plating a thermally conductive field layer on a second portion of the surface of the substrate adjacent the first portion of the surface of the substrate;
    wherein plating the thermally conductive field layer comprises plating first and second thermally conductive metal field layers wherein the thermoelectric p-n couple is electrically coupled in series between the first and second thermally conductive metal field layers and wherein each of the first and second thermally conductive metal field layers has a thickness that is at least half of a thickness of the thermoelectric p-n couple.

16. A method according to claim 10 wherein forming the thermally conductive metal field layers comprises selectively plating the thermally conductive metal field layers on the second portion of the surface of the substrate without plating the thermally conductive metal field layers on the first portion of the surface of the substrate.

17. A method according to claim 10 wherein the thermally conductive metal field layers comprises thermally conductive copper field layers.

18. A method according to claim 10 further comprising:
after forming the thermally conductive metal field layers, providing a thermal coupling between the thermoelectric p-n couple and a second substrate and between the thermally conductive metal field layers and the second substrate, so that the p-type thermoelectric element and the n-type thermoelectric element are thermally coupled in parallel between the first and second substrates.

19. A method according to claim 18 wherein the first substrate comprises a semiconductor integrated circuit substrate and wherein the second substrate comprises a thermally conductive heat spreader.

20. A method according to claim 19 wherein the semiconductor integrated circuit substrate is bonded to a third substrate so that the semiconductor integrated circuit substrate is between the third substrate and the thermally conductive heat spreader, the method further comprising:
bonding edges of the thermally conductive heat spreader to the third substrate.

21. A method according to claim 18 wherein the first substrate comprises a thermally conductive heat spreader and wherein the second substrate comprises a semiconductor integrated circuit substrate.

22. A method according to claim 21 wherein the semiconductor integrated circuit substrate is bonded to a third substrate so that the semiconductor integrated circuit substrate is between the third substrate and the thermally conductive heat spreader, the method further comprising:
bonding edges of the thermally conductive heat spreader to the third substrate.

23. A method according to claim 10 wherein the surface of the substrate comprises an electrically insulating material adjacent the p-n couple.

24. A method according to claim 10 wherein a first portion of the substrate adjacent the p-n couple comprises an electrically insulating material adjacent the p-n couple and wherein a second portion of the substrate adjacent the thermally conductive field layer is free of the electrically insulating material adjacent the thermally conductive field layer.

25. A method according to claim 10 wherein thermally coupling the thermoelectric p-n couple to the first portion of the surface comprises bonding the thermoelectric p-n couple to the first portion of the surface.

26. A method according to claim 24 wherein the thicknesses of the thermally conductive metal field layers are less than a thickness of the thermoelectric p-n couple.

27. A method according to claim 10 wherein thermally coupling the thermoelectric p-n couple to the first portion of the surface of the substrate precedes forming the thermally conductive metal field layers.

* * * * *